(12) United States Patent
Zehentner et al.

(10) Patent No.: US 7,355,436 B2
(45) Date of Patent: Apr. 8, 2008

(54) METHOD FOR ERROR DETECTION IN A DRIVE MECHANISM

(75) Inventors: Georg Zehentner, Teisendorf (DE); Norbert Huber, Teisendorf (DE); Eugen Kellner, Berchtesgaden (DE)

(73) Assignee: Dr. Johannes Heidenhain GmbH, Traunreut (DE)

( * ) Notice: Subject to any disclaimer, the term of this patent is extended or adjusted under 35 U.S.C. 154(b) by 638 days.

(21) Appl. No.: 10/633,275

(22) Filed: Aug. 1, 2003

(65) Prior Publication Data
US 2004/0085087 A1 May 6, 2004

(30) Foreign Application Priority Data
Aug. 2, 2002 (DE) ................. 102 36 377

(51) Int. Cl.
G01R 31/34 (2006.01)
G01R 31/02 (2006.01)

(52) U.S. Cl. .................... 324/772; 318/490
(58) Field of Classification Search ........... 324/772, 324/158.1; 318/490
See application file for complete search history.

(56) References Cited

U.S. PATENT DOCUMENTS

| | | | |
|---|---|---|---|
| 4,757,242 A * | 7/1988 | Prather | 318/473 |
| 5,008,608 A * | 4/1991 | Unsworth et al. | 318/729 |
| 5,266,891 A | 11/1993 | Kumar et al. | |
| 5,363,039 A * | 11/1994 | Kumar et al. | 324/158.1 |
| 5,796,231 A * | 8/1998 | Kyodo | 318/608 |
| 6,160,414 A | 12/2000 | Matsubara et al. | |
| 6,456,946 B1 * | 9/2002 | O'Gorman | 702/58 |
| 6,507,164 B1 * | 1/2003 | Healey et al. | 318/599 |
| 2003/0001537 A1 * | 1/2003 | Yang et al. | 318/727 |

FOREIGN PATENT DOCUMENTS

| | | |
|---|---|---|
| EP | 0 848 492 A1 | 6/1998 |
| WO | WO 97/14205 A1 | 4/1997 |

OTHER PUBLICATIONS

Rene Spee et al., "Remedial Strategies for Brushless DC Failures," IEEE Transactions On Industry Applications, vol. 26, No. 2, Mar./Apr. 1990, pp. 259-266.

* cited by examiner

*Primary Examiner*—Ha Tran Nguyen
*Assistant Examiner*—Roberto Velez
(74) *Attorney, Agent, or Firm*—Brinks Hofer Gilson & Lione

(57) ABSTRACT

A method for error detection in a drive mechanism, having a multiphase electric motor and a converter connected upstream thereof, wherein the converter controls voltages of individual phases of the electric motor, and individual phase currents in the individual phases of the electric motor each extend periodically. The method includes measuring a phase current of the electric motor at a predetermined point of a respective period, simultaneously varying a voltage that is associated with the measured phase current and evaluating a measured value of the measured phase current as a function of the voltage that is associated with the measured phase current.

35 Claims, 38 Drawing Sheets

Fig. 4

PWM - Signals
PWM1: 0 1 0 0 1 0 1 1
PWM2: 0 0 1 0 1 1 0 1
PWM3: 0 0 0 1 1 1 1 0

Test. Out:

Low Voltages  OK
    1, 0, 0, 0, 0, 1, 1, 1 // all   OK 1, 1, 0, 0, 1, 1, 0, 0 // PWM.U1 Stuck on 0
    1, 0, 1, 0, 1, 0, 1, 0 // PWM.U2 Stuck on 0
    1, 0, 0, 1, 1, 0, 0, 1 // PWM.U3 Stuck on 0

1, 1, 1, 0, 0, 0, 0, 1 // PWM.U1 = PWM.U2
    1, 0, 1, 1, 0, 1, 0, 0 // PWM.U2 = PWM.U3
    1, 1, 0, 1, 0, 0, 1, 0 // PWM.U1 = PWM.U3
    1, 0, 0, 0, 0, 0, 0, 0 // PWM.U1 = PWM.U2 = PWM.U3

Low Voltages  Faulty
    0, 1, 1, 1, 1, 0, 0, 0 // PWM Signals   OK 0, 0, 1, 1, 0, 0, 1, 1 // PWM.U1  Stuck on 0 + low voltage
    0, 1, 0, 1, 0, 1, 0, 1 // PWM.U2  Stuck on 0 + low voltage
    0, 1, 1, 0, 0, 1, 1, 0 // PWM.U3  Stuck on 0 + low voltage 0, 0, 0, 1, 1, 1, 1, 0 // PWM.U1 = PWM.U2 + low voltage
    0, 1, 0, 0, 1, 0, 1, 1 // PWM.U2 = PWM.U3 + low voltage
    0, 0, 1, 0, 1, 1, 0, 1 // PWM.U1 = PWM.U3 + low voltage
    0, 1, 1, 1, 1, 1, 1, 1 // PWM.U1 = PWM.U2  = PWM.U3 + low voltage General errors
    0, 0, 0, 0, 0, 0, 0, 0 // SH1 or SH2  not "0"
    1, 1, 1, 1, 1, 1, 1, 1 // Test – output open

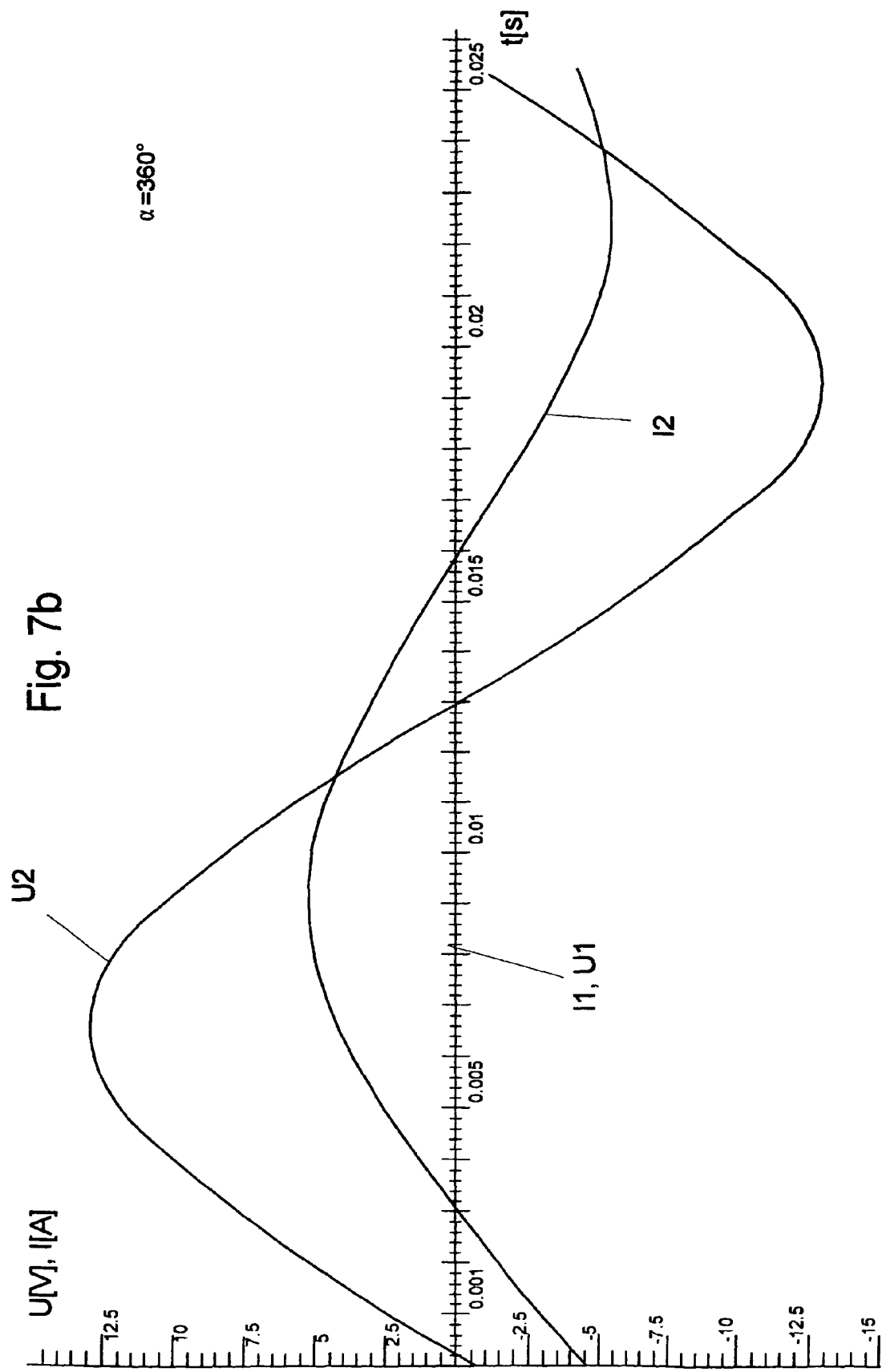

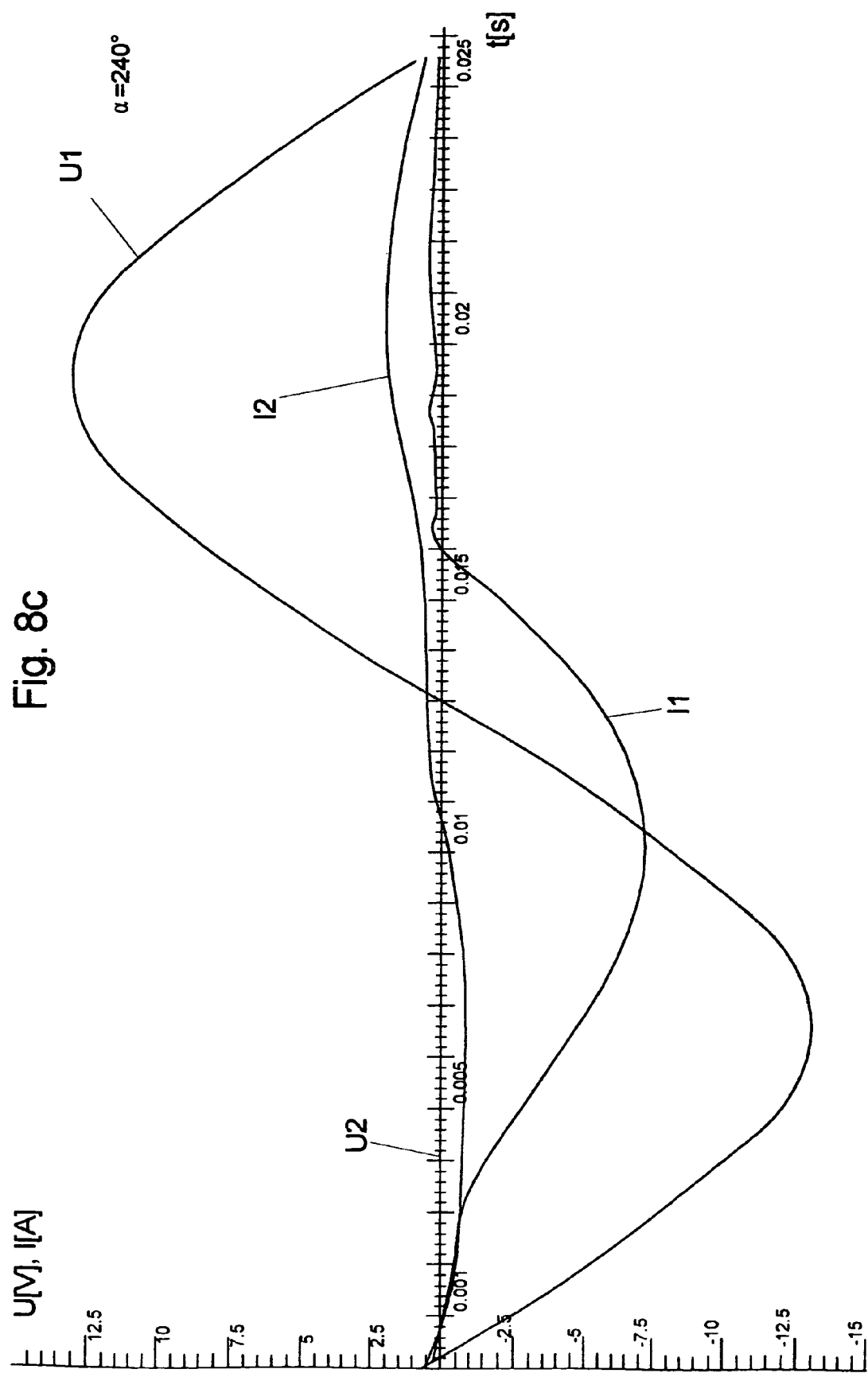

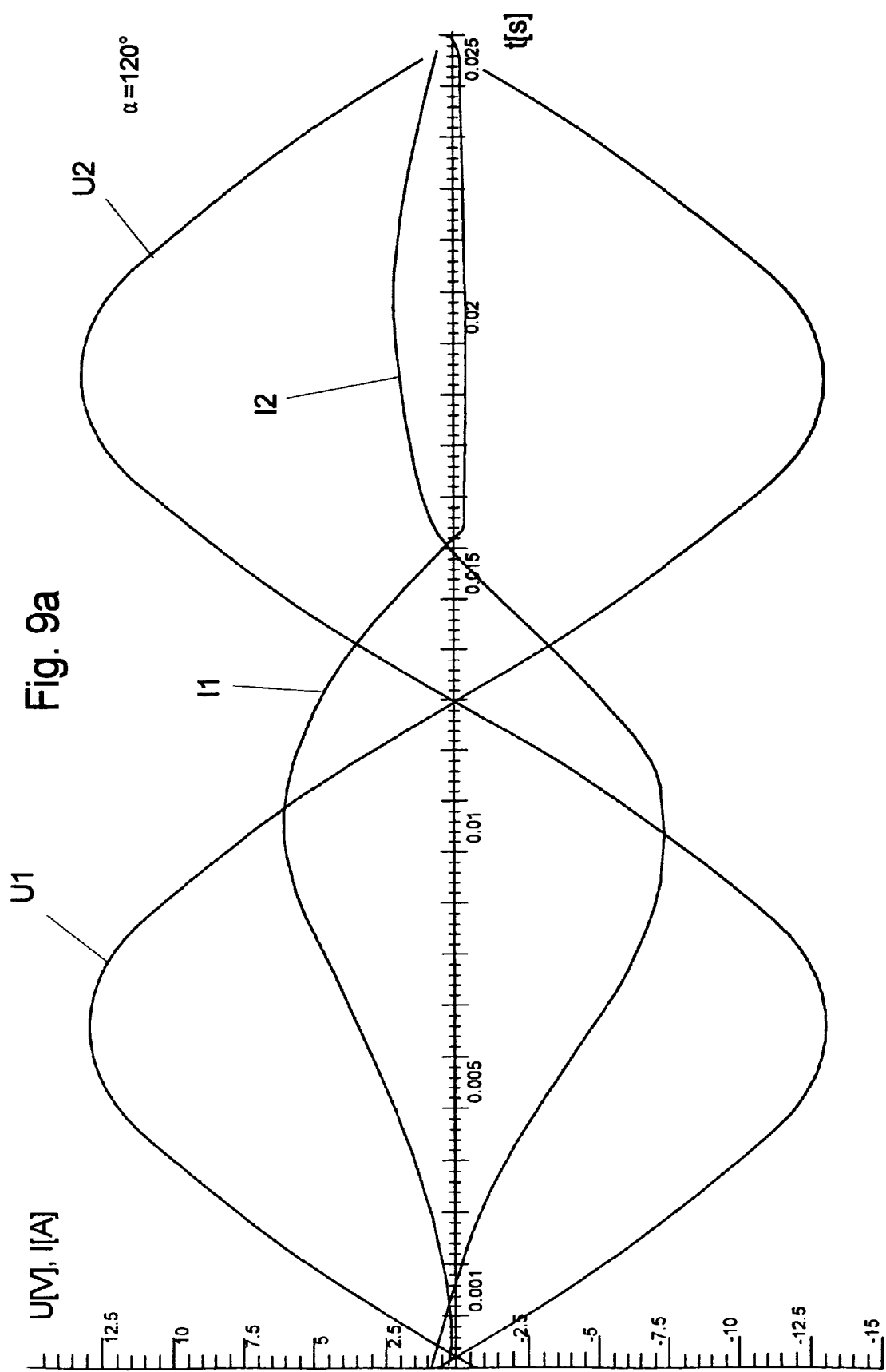

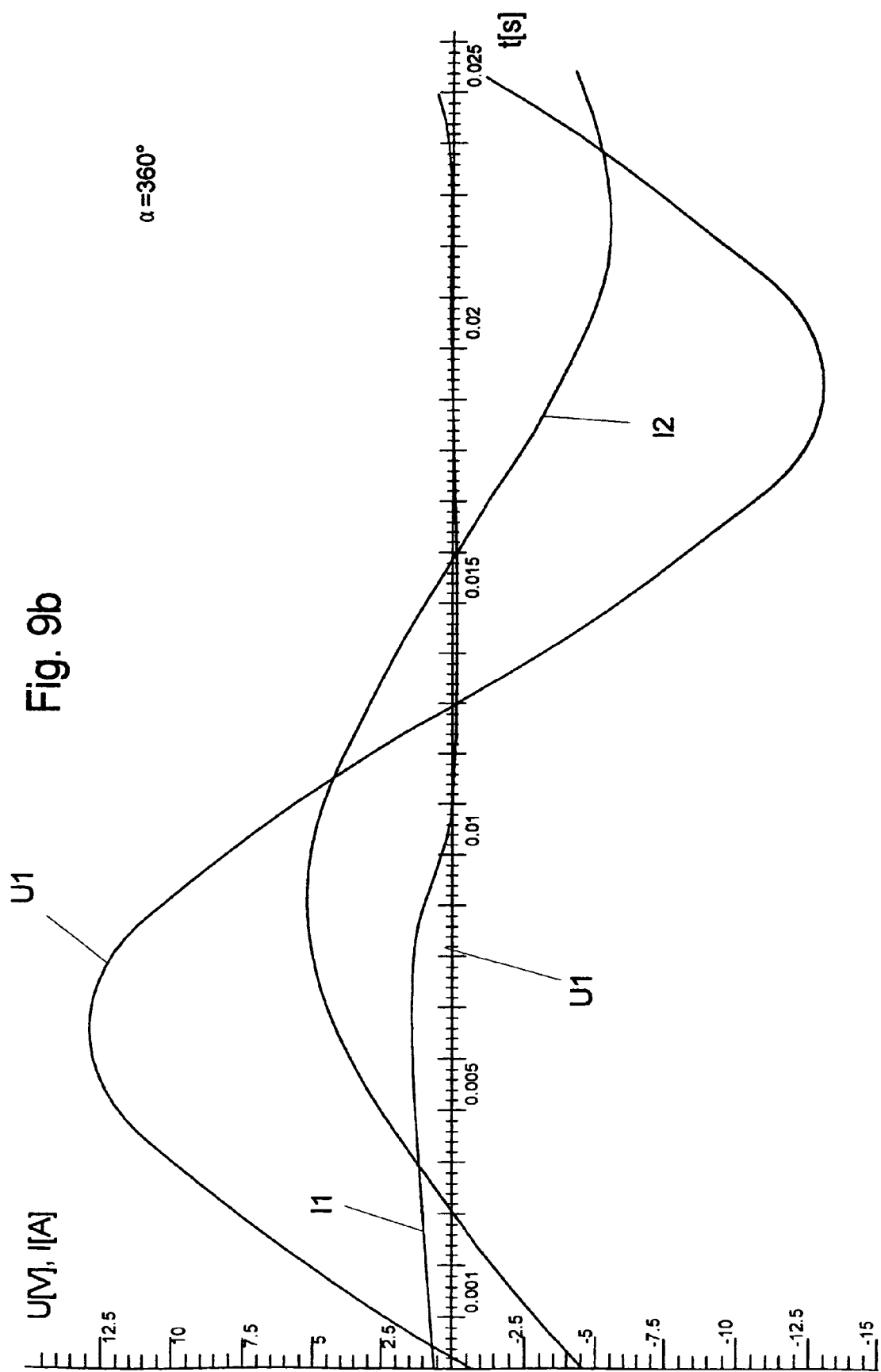

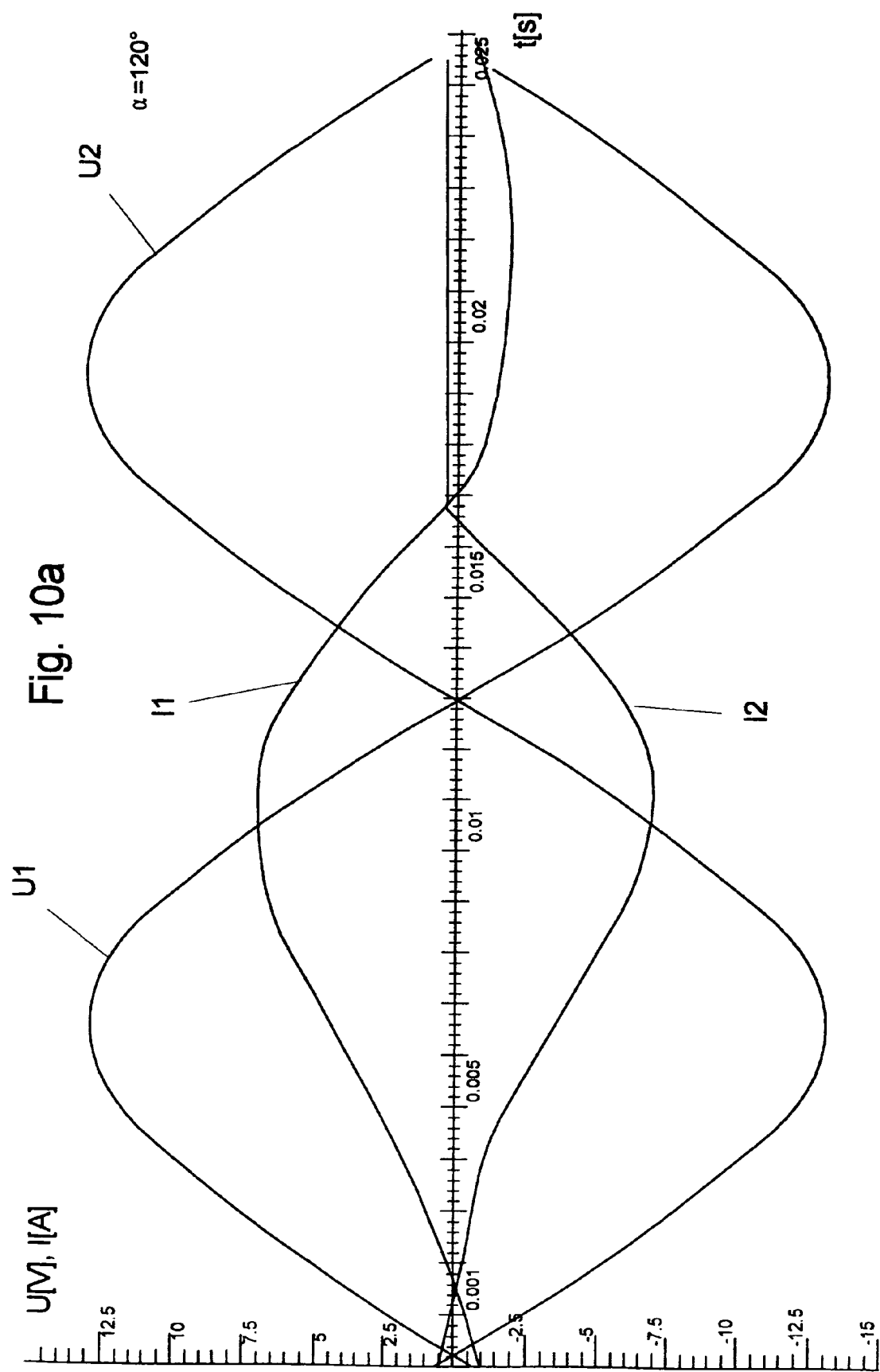

|  | Measurement Step 1 | Measurement Step 2 | Measurement Step 3 | Result |
|---|---|---|---|---|
| U1 | U | -U/2 | -U/2 | |
| U2 | -U/2 | U | -U/2 | |
| U3 | -U/2 | -U/2 | U | |
| -ERR | 1 | 1 | 1 | No short circuit |
|  | 0 | 0 | 1 | No short circuit Phase 11-12 |
|  | 0 | 1 | 0 | No short circuit Phase 11-13 |
|  | 1 | 0 | 0 | No short circuit Phase 12-13 |
|  | 0 | 0 | 0 | Perform test for Line-to-ground fault |

Fig. 17

METHOD FOR ERROR DETECTION IN A DRIVE MECHANISM

Applicants claim, under 35 U.S.C. §119, the benefit of priority of the filing date of Aug. 2, 2002 of a German patent application, copy attached, Serial Number 102 36 377.3, filed on the aforementioned date, the entire contents of which is incorporated herein by reference.

BACKGROUND OF THE INVENTION

1. Field of the Invention

The present invention relates to a method for error detection in a drive mechanism, having a multiphase electric motor and a converter connected upstream thereof, wherein the converter controls the voltage of the individual phases of the electric motor, and the phase currents in the phases of the electric motor each extend periodically and wherein, for error detection, several phase currents of the electric motor are measured at a predetermined point of the respective period, while the associated voltages at the respective phases of the electric motor are simultaneously varied, and measured values of the phase currents are evaluated as a function of the voltage at the respective phase of the electric motor.

2. Discussion of Related Art

Such a method is intended for detecting errors in a drive mechanism having a multiphase motor, in particular a three-phase motor, and a converter, wherein the converter controls the voltage at the phases of the electric motor and the phase currents (which are a function of said voltages) each extend periodically in the individual phase of the electric motor. The phase currents are measured here for detecting errors.

Methods for error detection in a drive mechanism by measuring phase currents are known, for example, from EP 0 848 492 A1 and U.S. Pat. No. 5,266,891, the entire contents of which are incorporated herein by reference.

OBJECT AND SUMMARY OF THE INVENTION

An object of the present invention is based on making available an improved method for error detection in a drive mechanism.

This object is attained in accordance with the invention by a method for error detection in a drive mechanism, having a multiphase electric motor and a converter connected upstream thereof, wherein the converter controls voltages of individual phases of the electric motor, and individual phase currents in the individual phases of the electric motor each extend periodically. The method includes measuring a phase current of the electric motor at a predetermined point of a respective period, simultaneously varying a voltage that is associated with the measured phase current and evaluating a measured value of the measured phase current as a function of the voltage that is associated with the measured phase current.

In accordance therewith, for error detection the phase currents are measured at a predetermined position of the respective period, i.e. at a predetermined angle of current flow, while simultaneously varying the voltages at the phases of the electric motor, and the measured values are evaluated as a function of the voltage at the respective phase of the electric motor.

The solution in accordance with the present invention is suitable for error detection in connection with drive mechanisms for machine tools, and makes possible the locating of errors, so that it is possible to distinguish between an error in the converter and an error in the downstream connected electric motor, without having to use separate measuring devices for the converter on the one hand and the electric motor on the other. Moreover, this allows a remote diagnosis of errors be a modem or via the internet.

The possibility for distinguishing between errors in the converter on the one hand and the electric motor on the other results from the fact that not merely the phase currents in the individual phases of the electric motor at defined angles of current flow are measured for error detection, but that simultaneously a variation of the electric voltages generating the currents takes place. The behavior of the currents as a function of the underlying electric voltage allows an evaluation leading on the one hand to a distinction between errors in the converter, and in the electric motor on the other hand. This will be explained in detail further down by means of examples. It is important here that the voltages are varied in the course of the measurements in such a way that the angle of current flow does not change, i.e. that the phase currents are each checked at a single constant point of the period.

The errors to be detected in connection with the electric motor relate in particular to a break in the lines of a phase of the electric motor, for example as the result of a line break or a contact which is not closed. The errors to be detected inside the converter can mainly relate to a faulty, i.e. not correctly switching, converter valve in the form of a transistor, in particular a so-called IGBT (insulated gate bipolar transistor).

A disruption in a phase of the electric motor is detected in that the respective phase current is always approximately equal to zero, regardless of the value of the underlying voltage (as a rule, the exact value of "0" does not occur because of measurement effects). In contrast to this, in case of a faulty, not correctly switching converter valve, a drop to the current value zero (not occurring with a correctly switching converter valve) can only be observed in a partial area of the underlying electrical voltage curve.

An angle of current flow is selected for evaluating the phase currents in such a way that at least one of the phase currents always equals zero during the measurement. For example, in case of sinusoidally extending phase currents, the measurement of the phase currents can take place at an angle of current flow at which one of the phase currents shows a zero-crossing.

In the course of measuring the phase currents, the voltages are preferably varied in such a way that the ratio of the voltages during the measurement remains constant. In particular, two voltages can be varied in such a way that the sum of the voltages during the measurement always equals zero. In a preferred embodiment of the present invention, the voltages at the individual phases of the electric motor are periodically varied, wherein each of the voltages passes through a full period in the course of the measurement.

The variation of the voltages can take place in a simple way on the basis of a sine curve, so that the voltages show zero-crossings which are important for a solid evaluation, which will be explained further down below.

The measurement of the phase currents can take place at several different angles of current flow, wherein the number of the measurements at different angles of current flow preferably corresponds to the number of the phases of the electric motor, and wherein a different one of the phase currents has the value of zero in each one of the measurements.

For evaluating the measurement results in regard to error detection, the measured phase currents can each be evaluated at defined points of the respective current flow which are based on the electrical voltage, for example at the maximum of the respective phase current between a maximum and a zero-crossing of the associated voltage. In this case the evaluation of the measurement results can be performed in a simple manner by a table.

It is not necessary to measure all phase currents directly, since one of the phase currents can be indirectly determined from the remaining phase currents.

The input signals of the converter are determined by output signals of a controller, in particular by pulse-width modulated signals (PWM signals). It is therefore useful to check the output signals of the controller for errors at the interface between the controller and the converter. In the course of this a check is made whether defined, predetermined patterns of the output signal of the controller generate the expected input signals (voltage signals) at the converter. An error has occurred if defined, predetermined output signals of the controller do no result in the expected voltage signals. The latter are linked with each other via a logical gate, in particular an EX.OR gate, for evaluating the voltage signals.

Within the scope of the present invention it is further also possible to check whether a short circuit between two phases of the electric motor exists. The check for a short circuit is always performed when the measurement of the phase currents has to be stopped because of an overcurrent in one of the converter valves of the converter. The detection of such an overcurrent can take place in a simple manner at the respective converter valve itself which had shut off because of an overcurrent.

Respectively two phases of the electric motors are placed on the same electrical potential for checking for a short circuit, and a check is then made whether the strength of one of the phase currents indicates a short circuit. The determination of the electrical potential of the individual phases can here take place by the suitable selection of an angle of current flow. By sequentially placing all possible combinations of two phases of the electric motor on the same potential, it is possible in case of the appearance of a short circuit to determine which of the two phases is short-circuited, since the short circuit can not be caused in the respective phases which are on the same potential.

If short-circuit currents should appear with all combinations, it is possible to perform a check for a line-to-ground fault of one of the phases. To this end the individual electrical circuits of the converter which are respectively assigned to one of the phases of the electric motor are charged with identical input signals. Each of these circuits can be constituted by transistors or thyristors arranged in pairs, in particular in the form of IGBTs arranged in pairs with associated recovery diodes.

Respectively one of two possible voltages is applied as the electrical potential to the respective phase of the electric motor by the electrical circuits assigned to the individual phases of the electric motor as a function of the respective input signal of the converter. In this case a line-to-ground fault exists if a current appears, although all phases of the electric motor have been placed on an identical electrical potential.

The solution in accordance with the present invention, and its further developments described above, are particularly suitable for use in a three-phase motor.

Further characteristics and advantages of the present invention will become apparent in the course of the subsequent description of the drawing figures.

BRIEF DESCRIPTION OF THE DRAWINGS

FIG. 4 is a possible table for evaluating the circuit in accordance with FIG. 3 in accordance with the present invention;

FIG. 17 is a representation in the form of a table of the results of an embodiment of a method for detecting a short circuit between two phases of the electric motor in FIG. 1 in accordance with the present invention.

DETAILED DESCRIPTION OF THE PREFERRED EMBODIMENTS

Figure 1:
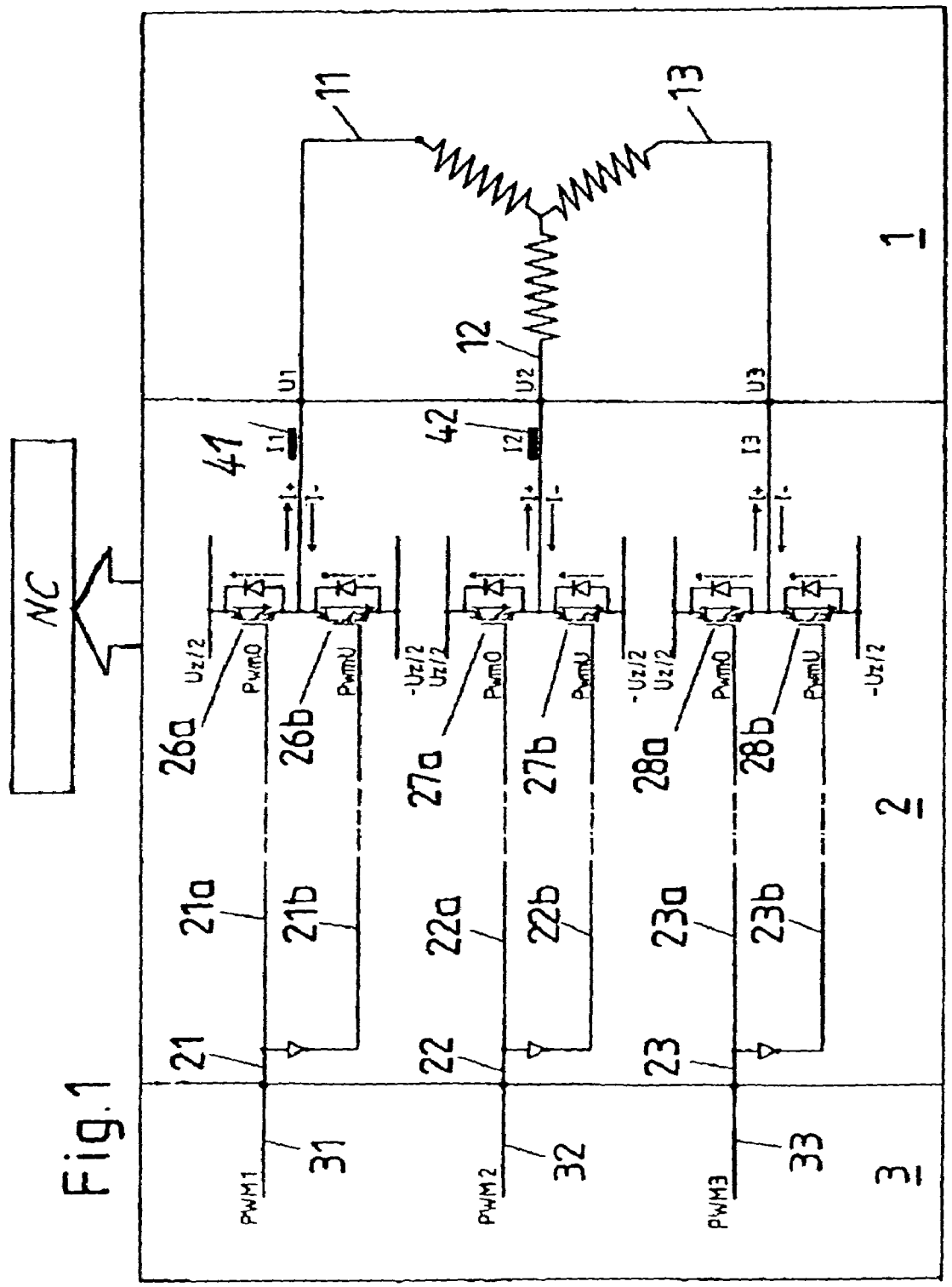
FIG. 1 represents a schematic electrical circuit diagram of an embodiment of an electric motor with an upstream-connected frequency converter.

A drive mechanism for machine tools is represented in FIG. 1, which has a multiphase electric motor in the form of a three-phase motor 1, a converter in the form of a frequency converter 2 connected upstream of the motor 1, as well as a controller 3 for generating PWM signals for the frequency converter 2. The three phases 11, 12, 13 of the drive motor 1 are schematically represented in FIG. 1 as coils with associated feed lines. A numerical control NC controls the motor 1 as a forward feed motor or a spindle motor.

The frequency converter 2 (power element) connected upstream of the drive motor 1 is constituted by three pairs of IGBTs 26a, 26b, 27a, 27b, 28a, 28b with associated recovery diodes. Moreover, an electrical feed line 21a, 21b, 22a, 22b and 23a, 23b is assigned to each IGBT 26a, 26b, 27a, 27b, 28a, 28b.

Each one of these pairs of IGBT 26a, 26b, 27a, 27b, 28a, 28b, together with the associated recovery diodes and the feed lines 21a, 21b, 22a, 22b, 23a, 23b, constitutes an electrical circuit 21, 22 or 23 which, as a function of the input signals from the frequency converter 2, or the output signals from the controller 3, switches an upper intermediate circuit voltage Uz/2, or a lower intermediate circuit voltage −Uz/2 to the respectively associated phase 11, 12 or 13 of the drive motor 1. Two of the phase currents I1, I2 in the first phase 11 or the second phase 12 of the drive motor 1 resulting from this are measured by the current sensors 41, 42. The phase current I3 in the third phase 13 of the drive motor 1 can be determined from the measured values of the two other phase currents I1, I2. In this case a current can only flow in the drive motor if at least two of the three voltages U1, U2, U3 at the phases 11, 12, 13 of the electric motor 1 are different, i.e. at least one of the voltages U1, U2, U3 has been set to the value Uz/2, and another to the value −Uz/2.

Figure 3:
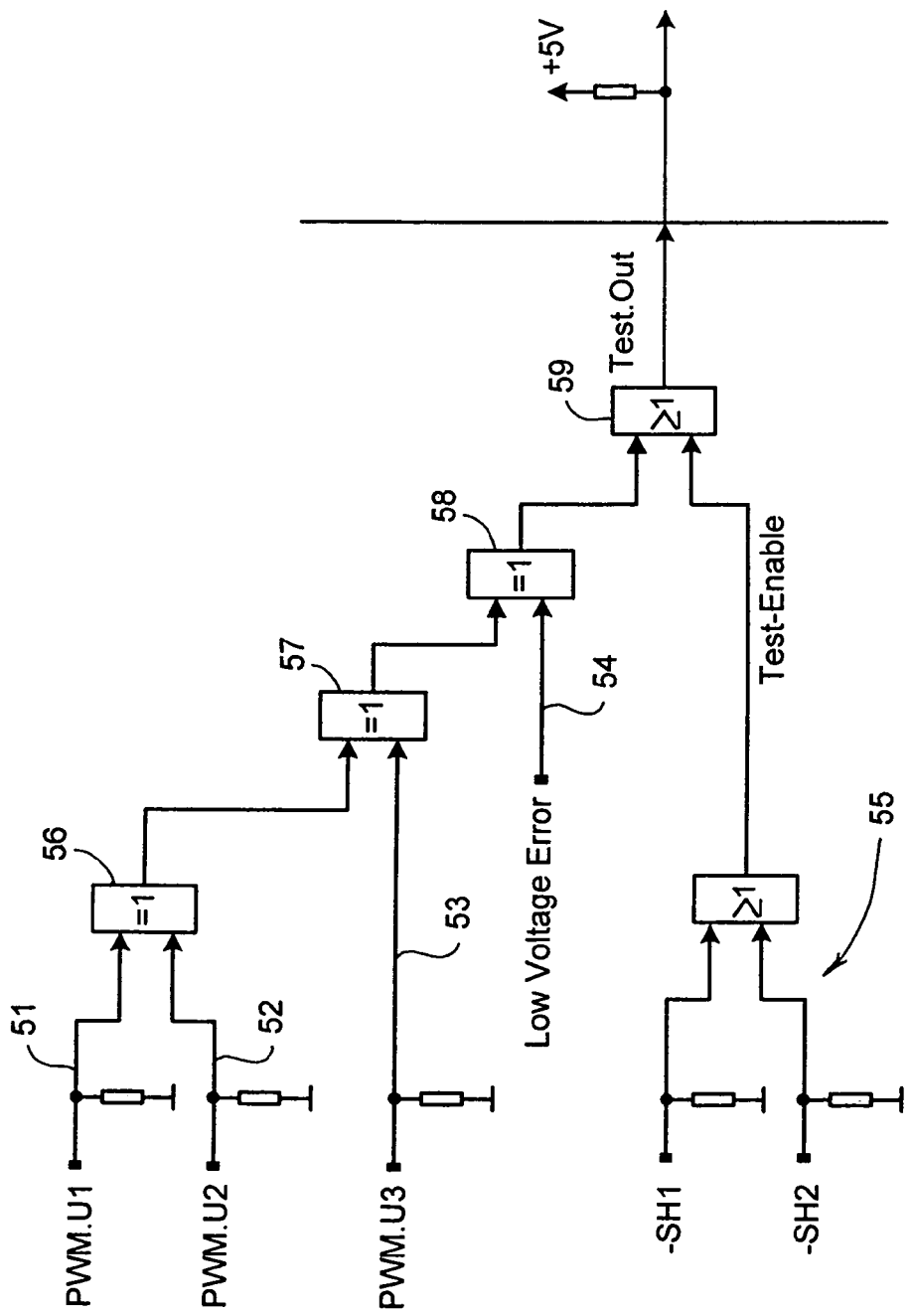
FIG. 3 is a schematic representation of an embodiment of an evaluation circuit for detecting errors at the interface between the frequency converter from FIG. 1 and an embodiment of an upstream-connected controller in accordance with the present invention.

Of the controller 3, whose output signals PWM1, PWM2 and PWM3 determine the input signals of the frequency converter 2, only the electric lines 31, 32, 33 are represented in FIG. 3, which constitute the interface with the frequency converter 2 and are assigned to respectively one of the electrical circuits 21, 22, 23 of the frequency converter 2. The output signals generated by the controller 3 are respectively rectangular signals, whose pulse-duty factor is a function of the desired reference values for the current in the drive motor 1.

Drive mechanisms for machine tools of the type represented in FIG. 1 are known. A description of how an error detection can be performed for such a drive mechanism will be provided by the further drawing figures, which not only makes possible a dependable detection of occurring errors, but also their localization. It is intended in particular to make a distinction between the occurrence of an error in the drive motor 1 and in the frequency converter 2 without the provision of additional measuring devices, in particular separate measuring devices for the detection of errors in the drive motor 1, on the one hand, and the frequency converter 2, on the other.

Figure 2:
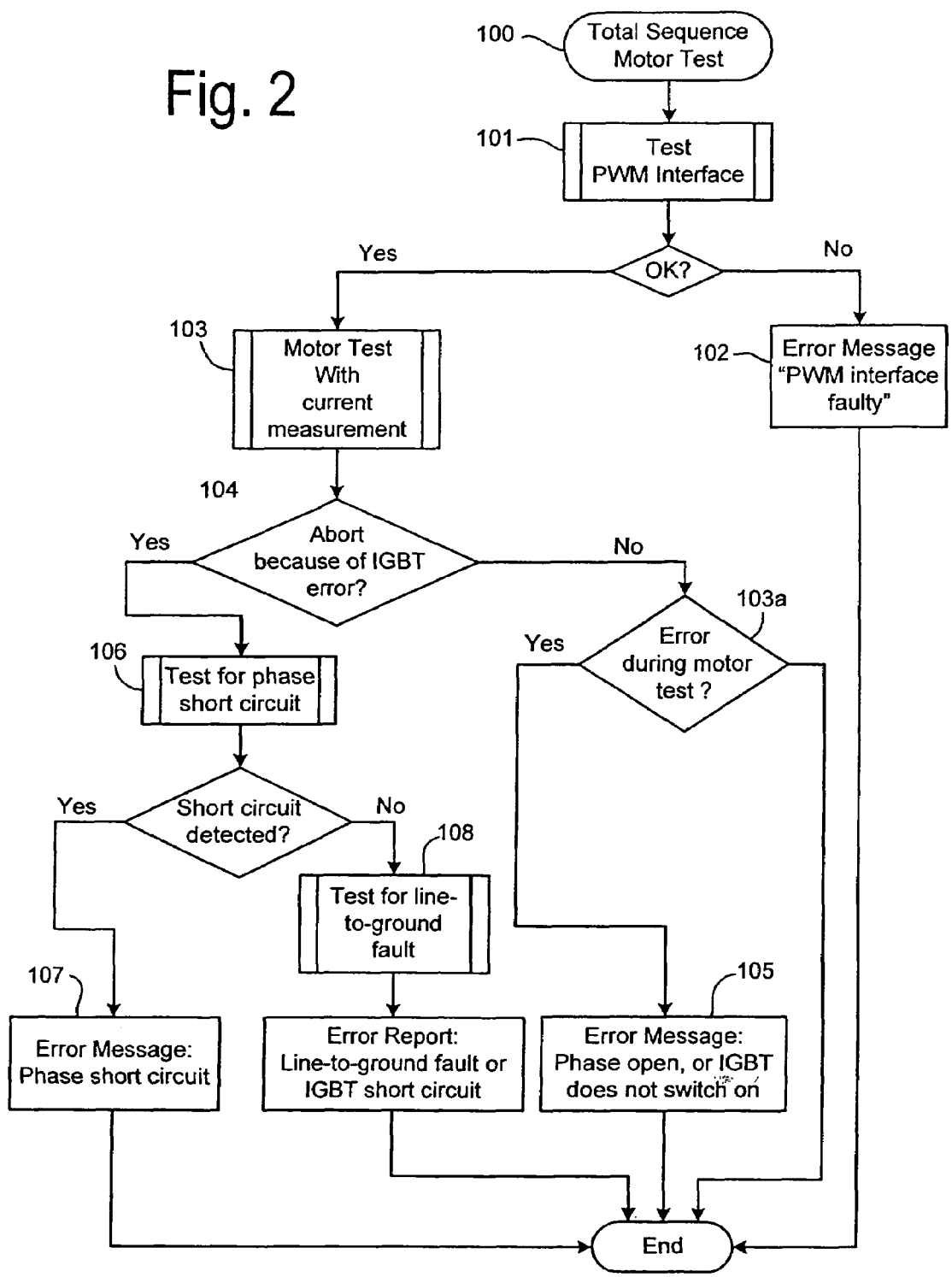
FIG. 2 is a flow chart of an embodiment of a method for error detection in a drive mechanism in accordance with FIG. 1 in accordance with the present invention.

FIG. 2 shows an overview of the total sequence of an error test 100 for the drive mechanism from FIG. 1 by a flow chart.

The interface between the controller 3 and the frequency converter 2 is checked in a first test step 101. i.e. a test is performed whether the PWM signals generated by the controller arrive correctly at the frequency converter 2 and whether all required auxiliary voltages for controlling the IGBTs are present. If an error is detected during this test, the error message 102 "Error in PWM interface" and the test is terminated, since further test functions cannot be performed in a meaningful way as long as it has not been assured that correct input signals have been provided to the frequency converter 2.

If no errors appeared during the test of the interface between the frequency converter 2 and the controller 3, a "motor test with current measurement" is performed in the next step 103. In the course of this the electrical voltages, on which three different angles of current flow of the three-phase current driving the drive motor 3 are based, are sinusoidally varied. In this case the angle of current flow is selected in such a way that the current is zero in one of the three motor phases, therefore the associated voltage also has the constant value of zero.

With three different angles of current flow, a total of six measurements of the phase current which can be evaluated result from a separate evaluation of the two half-waves of the sinusoidally extending voltages. Evaluation is performed by a table, from whose entries it can be determined whether an error in the drive mechanism is caused by an IGBT, which does not switch on, or a disruption in a phase of the drive motor. In the course of this, use is made of an effect wherein the respectively induced phase current, depending on the sign, flows off via the associated recovery diode either to the positive or the negative intermediate circuit voltage bar in the respective electrical circuit 21, 22, 23 of the frequency converter 2.

In the course of this test a determination is simultaneously made whether one of the IGBTs of the frequency converter 2 switches off because of an overcurrent. If no IGBT error 104 in the form of an overcurrent is detected, the evaluation 103a of the measured values from the current measurements 103 takes place and, if required, an error message 105 is issued, which indicates an open phase in the drive motor 1 or an error in the frequency converter 2 (disconnected IGBT).

If, however, an overcurrent is detected in one of the IGBTs, a check is made in the next step 106 whether it is a phase short circuit, i.e. whether two phases of the drive motor 1 are short-circuited. Again, measurements at the different angles of current flow are performed, wherein the angles of current flow in the individual measurements are selected in such a way that respectively two of the phases are on the same electrical potential, i.e. that the same intermediate circuit voltage has been switched in. In the course of evaluating the measurements, consideration is given to the fact that in the presence of a short circuit of two phases during the current measurement switch-off because of an overcurrent does not take place only if there is no potential difference between the two affected phases at that time, i.e. the two phases have been switched to the same intermediate circuit voltage. Following the detection of a short circuit, the test is terminated with the error message 107 "phase short circuit".

If a switch-off because of an overcurrent takes place at all three angles of current flow, a test 108 for a line-to-ground fault is performed. In the course of this the output signals (PWM signals) of the controller 3 are initially set fixed to "1", and then fixed to "0". If there is a line-to-ground fault, a switch-off because of an occurring overcurrent will take place with both measurements. But in case of a short circuit in an IGBT, an overcurrent will only occur when the further IGBT, which is assigned as a partner to the defective IGBT, has been switched on. By this it is therefore possible to distinguish between whether an overcurrent is caused by a line-to-ground fault of one of the phases of the drive motor 1, or by a short circuit in an IGBT of the frequency converter 2.

In what follows, the error tests which are represented together in FIG. 2 will be individually explained in greater detail.

FIG. 3 represents an evaluation circuit for performing and evaluating the test 101 (FIG. 2) for errors at the interface between the controller 3 and the frequency converter 2. The evaluation circuit contains three connections, which are respectively assigned to one of the feed lines 31, 32, 33 (FIG. 1) at the interface between the controller 3 and the frequency converter 2. The first two connections are made via respective electrical lines 51, 52 with the inputs of a logical gate 56 in the form of an EX.OR gate. The output signal from this first EX.OR gate 56 is supplied to a second EX.OR gate 57, to whose input the signal occurring at the third connection of the evaluation circuit is supplied via a line 53. In turn, the output of the second EX.OR gate is connected with an input of a third EX.OR gate 58, which is in addition supplied with the result of a self-test circuit 54, which checks the presence of all low voltages (of 15 V or 24 V) required for controlling the IGBTs. The output signal of the third EX.OR gate 58 is supplied to a logical gate 59 in the form of a NOR gate, whose input is furthermore connected with a circuit 55 for activating the test of the interface.

For performing the error test at the interface between the controller 3 and the frequency converter 2, the controller is operated in such a way that defined patterns of PWM signals can be expected in the lines 31, 32, 33, which constitute the interface. Each one of these patterns corresponds to a defined distribution of the values "1" and "0" of the PWM signals PWM1, PWM2, PWM3, which are to be made available by the controller 3 in the corresponding lines 31, 32, 33 of the interface. The voltage signals PWM.U1, PWM.U2, PWM.U3 generated because of these signals in the lines 51, 52, 53 on the input side of the evaluation circuit 5, which respectively represent the value "1" or "0" of the associated PWM signal, are linked together in the first two EX.OR gates 56, 57. Added to this is the linkage with the self-test circuit 54, which checks for the existence of all required low voltages and which, in the case of an error, provides the value "1", otherwise the value "0", to the corresponding input of the third EX.OR gate 58. The result of these three linkages in the EX.OR gates 56, 57, 58 is supplied to the NOR gate 59 (inverter) whose input, at the activation of the test circuit, is additionally charged with the value "0" by the control lines for test activation, since both the control lines SH1, SH2 are each set to the value "0".

For evaluating the values obtained by the evaluation circuit 5, the patterns of the three PWM signals PWM1, PWM2, PWM3, as well as the output signal of the NOR gate 59 measured as a function of the respective pattern, are stored in a table.

In the form of a table, FIG. 4 shows for all eight possible patterns of the three PWM signals, from "000" to "110", what values ("test.out") can appear at the output of the NOR gate 59, and what conclusions can be drawn from them.

The first three lines of the table in FIG. 4 provide the possible combinations (patterns) of the three PWM signals, as a function of which the output signal (test out) is generated at the NOR gate 59. In this case the eight columns of the table relate to the eight different possible combinations of the three PWM signals.

The next eight lines of the table under the heading "low voltages ok" provide the possible output signals ("test.out") for all eight combinations of PWM signals in the case where no low voltage error has occurred. The first of these eight lines represents the case where no error has been observed at the interface between the controller 3 and the frequency converter 2. In this case, with the signal combination "000" at the inputs of the evaluation circuit, the value "1" will appear at the output of the NOR gate 59, with a signal combination "100" at the output, the value "0" appears, etc.

Each of the next seven lines represents results wherein the signal appearing at the interface does not correspond to the signal expected based on the setting of the controller. The corresponding errors resulting from the respective evaluation of the eight possible combinations of the desired PWM signals, as well as the associate output signal ("test.out"), at the inverter 59, are respectively indicated at the end of the table.

The next eight lines relate to the case wherein an error has occurred during the self test of the low voltages, so that accordingly the value "1" is set at the input of the third EX.OR gate 58 by the appropriate circuit 54.

The error message "PWM.U1" is stuck on 0", for example, indicates that in the corresponding feed line 51 the signal PWM.U1 represented by a voltage always assumes the value "0" although, as a function of the respective pattern of the three PWM signals, this value should swing between "0" and "1". This error can be caused by a break in the line, for example. The indication "PWM.U1=PWM.U2" indicates that the same signal is always measured in the two respective lines 51, 52 of the evaluation circuit 5, although this should only be the case in four of the total of eight possible combinations of the PWM signals.

The two last lines of the table indicate "general errors" in the evaluation circuit. In the first case the test circuit is not activated at all, therefore the error already lies in the respective control lines SH1, SH2. In the second case the output of the test circuit ("test.out") is open.

Figure 5:
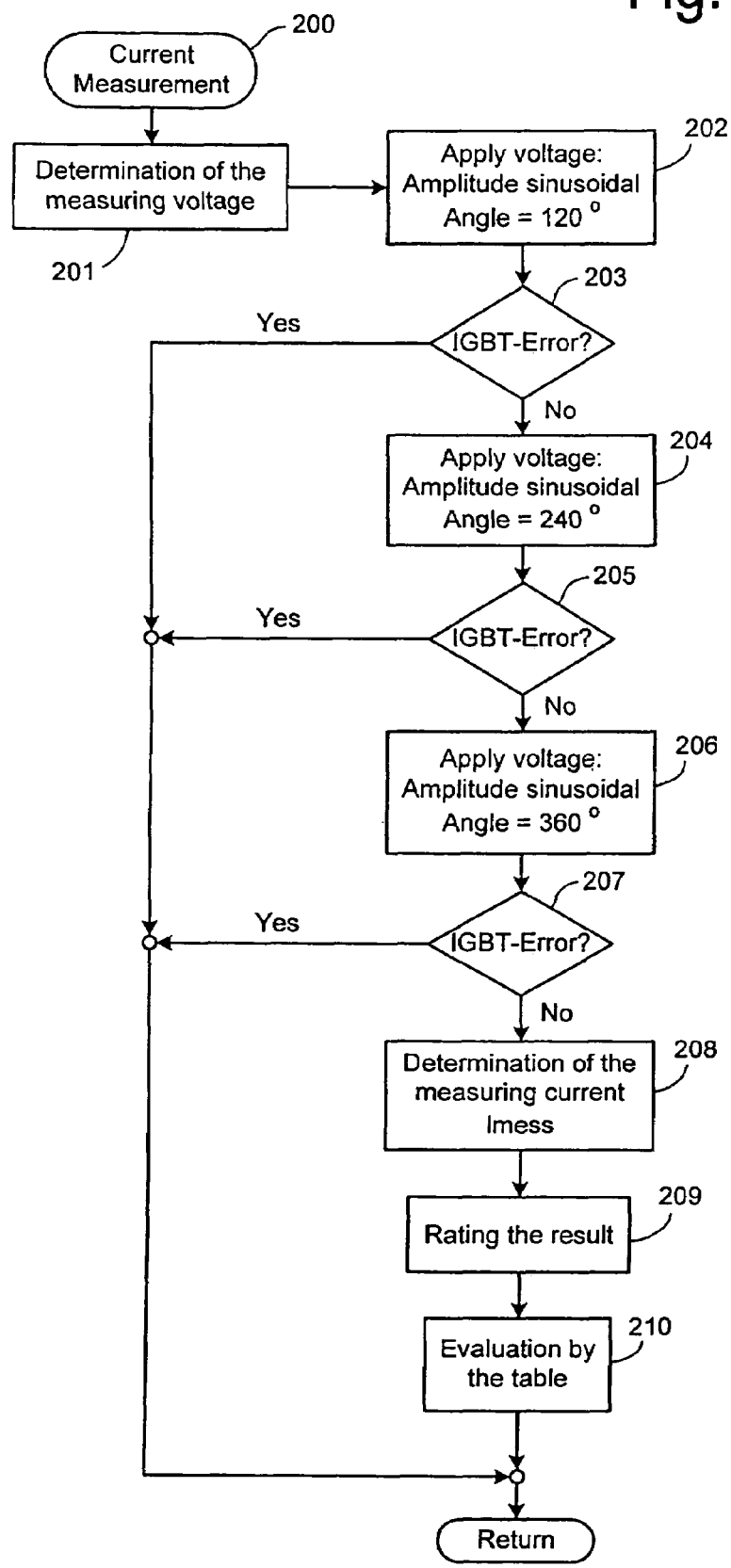
FIG. 5 is a flow diagram for the more detailed explanation of a possible method step from FIG. 2 regarding the discrimination of errors in the electric motor, on the one hand, and the upstream-connected frequency converter on the other in accordance with the present invention.

At the termination of the checks of the signals present at the interface between the controller 3 and the frequency converter 2 described by means of FIGS. 3 and 4, the actual core element of the error diagnosis takes place, namely the detection of errors in the frequency converter 2 or the drive motor 1 by means of the measurement of the phase currents l1, l2, l3 in the individual phases 11, 12, 13 of the drive motor 1. An overview regarding the sequence of the respective measurements is represented in the flow chart in accordance with FIG. 5. The sequence of measurements represented in FIG. 5 is performed by a microprocessor within the numerical control NC of FIG. 1.

The aim of this test is not only to detect the presence of an error, but also to localize the source of this error, in particular to distinguish between a disruption of a phase of the drive motor 1, for example because of a break in a line (also a break in the winding of the motor), or an open contact, and an error in the frequency converter 2, for example as the result of a disconnected IGBT.

Following the activation of the current measuring device 200, the underlying voltages are initially determined. For this purpose, the voltage, which induces the nominal current desired for the measurement in the motor, is determined from the electrical data of the motor which can be polled from the motor control. The actually induced current will be checked again later during the measurement. If the difference from the desired nominal current exceeds a predetermined value, the measuring voltage is matched, so that the maximally permissible current of the motor is induced for a new measurement in the drive motor 1. This matching of the voltage is based on a linear connection between the current and the voltage. If the electrical data of the motor are not available, there is the alternative option of slowly approaching the nominal current from a voltage which initially is selected to be low. The measuring voltage is selected in such a way that the phase currents induced in the drive motor 1 are clearly distinguished over the background noise, on the one hand, and that on the other hand damage to the drive motor 1 by too strong currents is prevented.

After determining the measuring voltage, in a next step 202 with a first angle of current flow wherein one of the phase currents l1, l2, l3 is zero, a measurement of the remaining two phase currents as a function of a sinusoidal variation of the measuring voltage takes place in such a way that the voltage passes through exactly one period.

Subsequently thereto a check is made whether in the course of the measurement an IGBT error 203 has occurred, i.e. whether one of the IGBTs of the frequency converter 2 was switched off because of an overcurrent. In this case the measurement is terminated with an appropriate error message.

Otherwise, the current measurement is continued, namely at two further angles of current flow of the three-phase current used for supplying the drive motor 1, so that the measurement is performed at a total of three angles of current flow, and during each measurement a different one of the phase currents l1, l2, l3 has the value "0". Furthermore, following each one of the further current measurements 204, 203, an inquiry as to the presence of an IGBT error 205 or 207 is performed and, if such should be the case, the measurement is again terminated with an error message.

If no IGBT error has occurred in any of the current measurements, in a next step 208 the maximum of the current amount which had occurred during the measurement is determined and is used in the form of lmess for standardizing the results. Subsequently a rating 209 of the measurement results takes place for preparing the error detection, as well as an evaluation 210 of the results of the rating by means of a table.

In what follows, the performance of the individual current measurements, the rating of the measurement results, as well as the evaluation of the results for error detection will be described more accurately. The evaluation is performed only if none of the IGBTs was switched off because of an overcurrent during the current measurement, and the measurement as a whole was not interrupted. Because in that case a check for short-circuited phases, or line-to-ground faults, as explained above by means of FIG. 2, would be performed, instead of an evaluation of the current measurement.

Figure 6:
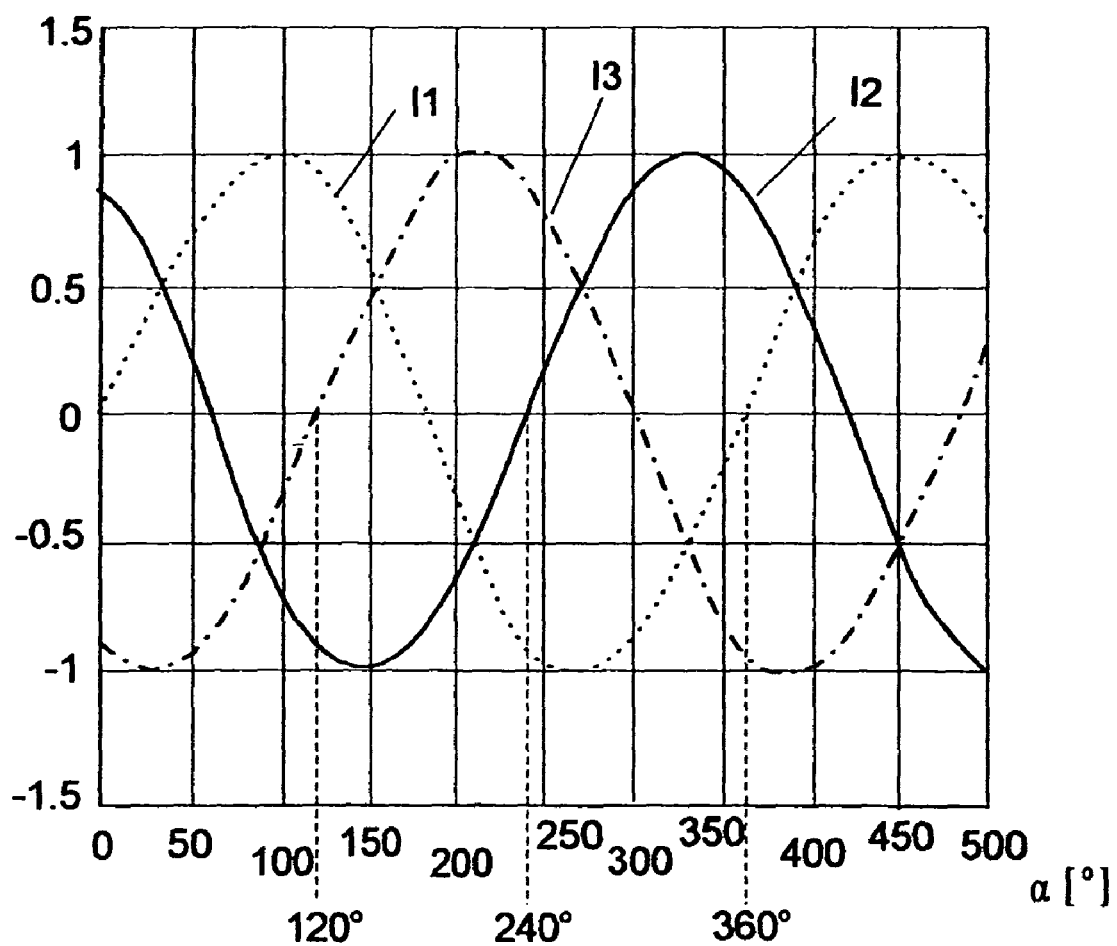
FIG. 6 is a representation of the ideal path of the phase currents in the electric motor from FIG. 1.

FIG. 6 shows the ideal path of the three phase currents I1, I2, I3 of the drive motor 1 within an angular range between 0° and 500°. Each of the three phase currents I1, I2, I3 extends sinusoidally, and they are phase-shifted by 120° from each other. The path of the phase currents is determined by the PWM signals which are supplied as output signals of the controller 3 to the frequency converter 2 and therefore determine the potential which is supplied to the individual phases 11, 12, 13 of the drive motor 1 at specific times.

For performing the current measurements, by which errors in the frequency converter 2, on the one hand, and in the drive motor 3, on the other, are intended to be detected, the PWM signals PWM1, PWM2 and PWM3 are here set in such a way that respectively one of the three phase currents I1, I2, I3 is zero, and the other two phase currents have the same value, but opposite signs. This is the case at angles of current flow of 120°, 240°, as well as 360°, as can be seen in FIG. 6.

Thereafter, at the respectively preset angle of current flow, the underlying voltages (potentials) at the phases 11, 12, 13 of the drive motor 1 are chronologically varied in such a way that the phases of the two currents which are not equal to zero at the actual angle of current flow pass through a full sinus period and have the same value, but opposite signs, at any time. The third of the three voltages U1, U2, U3 is in this case zero and belongs to the phase current which has the value zero at the corresponding angle of current flow. In this case the amplitude of the chronologically varied voltages is fixed by the measuring voltage which had been determined at the start, as described above.

Only the first two phase currents I1, I2 (provided they equal zero) and the associated voltages U1, U2 (provided they do not equal zero) are represented in the subsequent drawing figures, which show the results of the above described current measurements, since in accordance with FIG. 1, a current sensor 41 or 42 is associated only with these two phase currents I1, I2 for current measurement. The conditions in the third phase 13 of the drive motor 1 can be calculated from the results regarding the first two phases 11, 12.

Figure 7A:
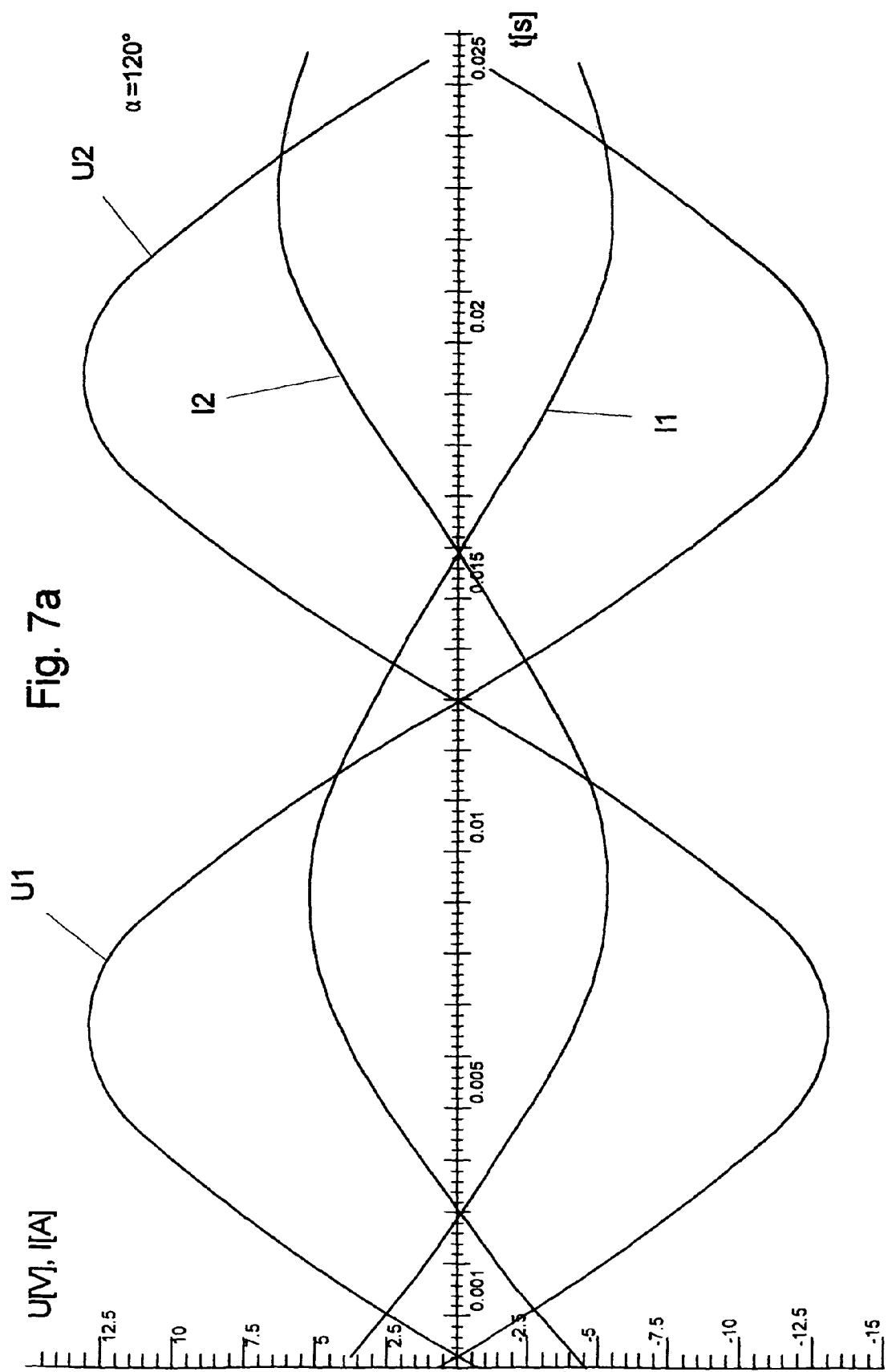
FIGS. 7a to 16c represent different relevant measurement results when executing the method in accordance with FIG. 5.
Figure 7C:
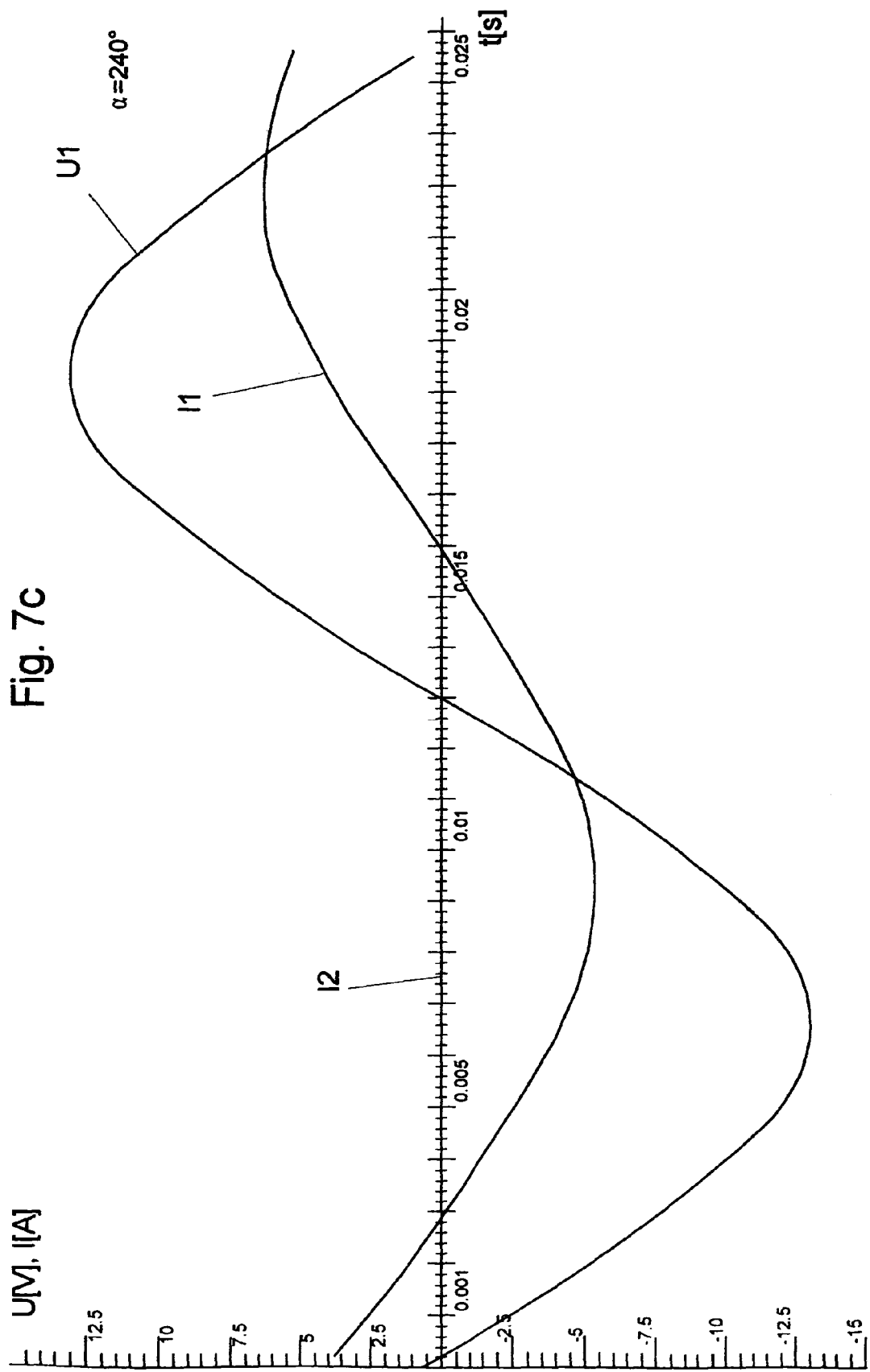

FIGS. 7a to 7c show the results of the measurements at the angles of current flow of 120°, 360°, as well as 240°, namely in a drive mechanisms in which no error to be detected is present in the frequency converter 2 or the drive motor 1. It can be clearly seen that the measured phase currents I1, I2 each follow the associated voltage U1 or U2. This means that the zero-crossings and the maxima of the phase currents I1, I2 chronologically slightly trail the corresponding zero-crossings and maxima of the underlying voltages U1, U2.

The result of the measurement at an angle of current flow of 120°, corresponding to FIG. 7a, furthermore shows that the two measured phase currents I1, I2 each run through a complete period in accordance with the underlying voltages U1, U2.

In the measurement represented in FIG. 7b at an angle of current flow of 360°, the first phase current I1 and the associated voltage U1 are each constantly equal to zero, since this phase current I1 has a zero-crossing at an angle of current flow of 360°, see FIG. 6. This is correspondingly applicable for the measurement represented in FIG. 7c at an angle of current flow of 240° in regard to the second phase current I2 and the associated voltage U2.

Figure 8A:
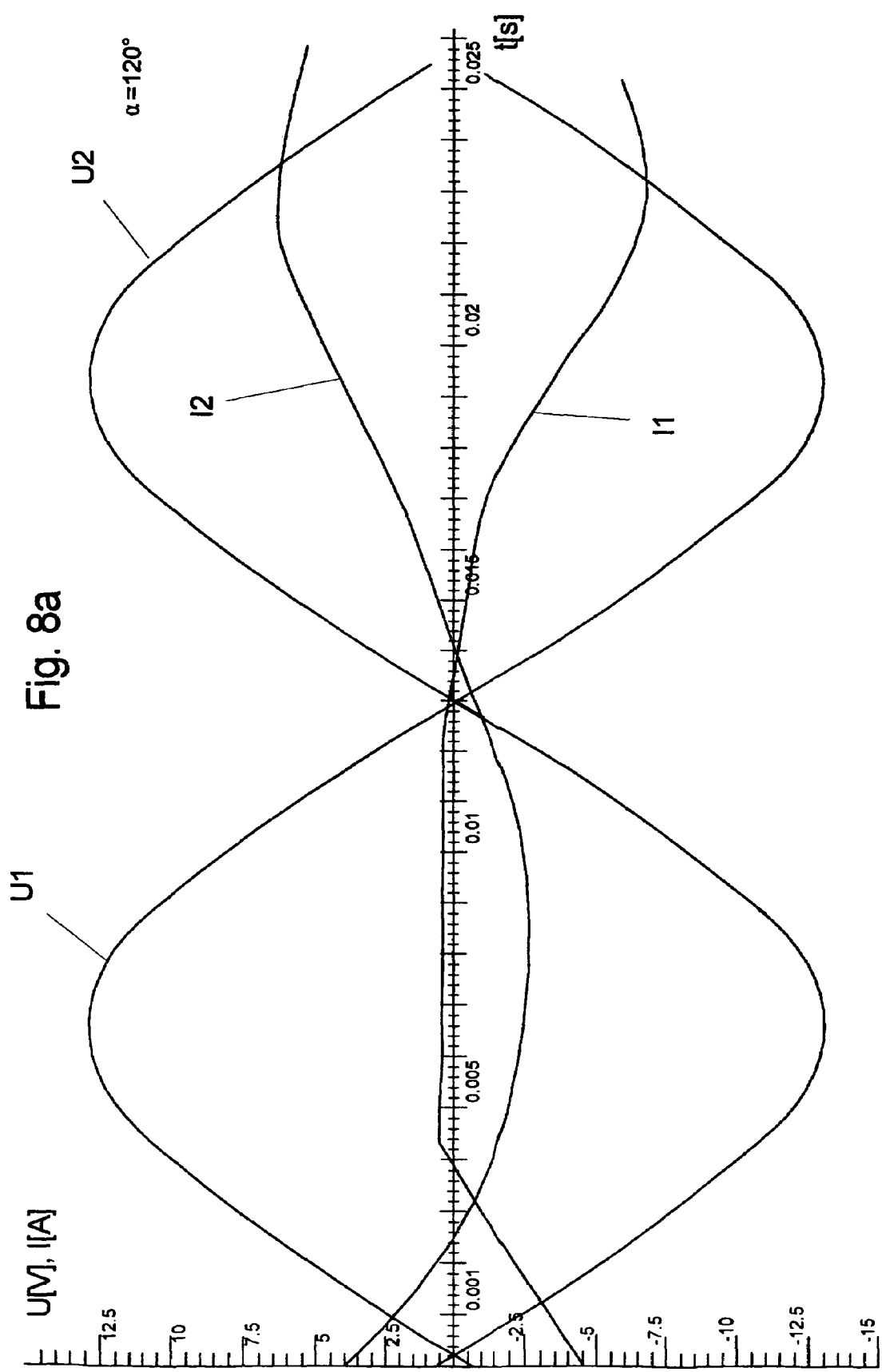
Figure 8B:
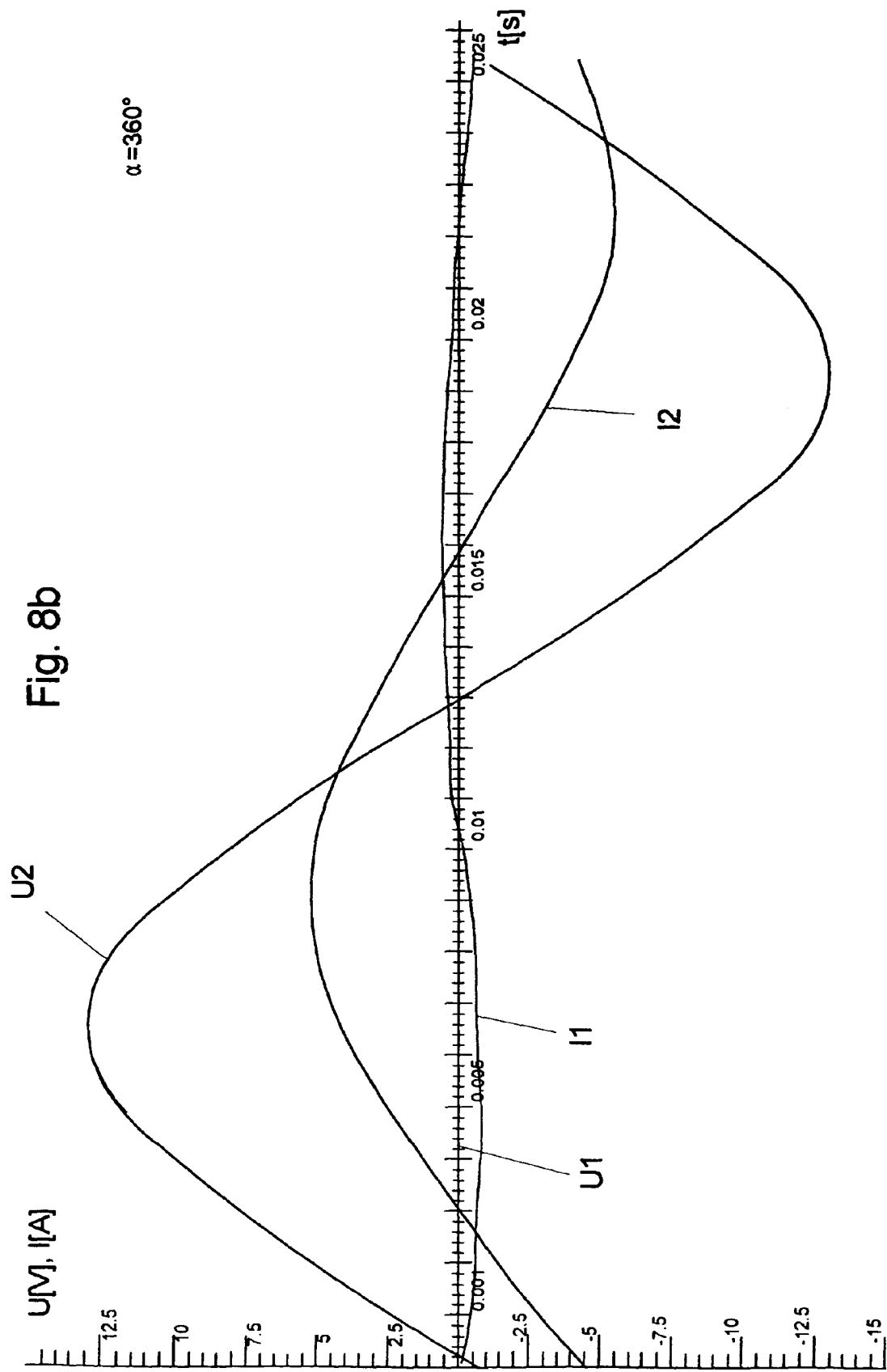

FIGS. 8a to 8c show three measurements under the same conditions as described by FIGS. 7a to 7c wherein, however, the upper IGBT 26a of the first electrical circuit 21 of the frequency converter 2 is malfunctioning, i.e. does not correctly switch on. This becomes apparent from the behavior of the first phase current I1 at a positive associated voltage U1.

As explained above by FIG. 1, with a positive voltage (corresponding to the value "1" of the PWM signal) generated by the appropriate PWM signal PMW1, PMW2 or PMW3, the appropriate upper IGBT 26a, 27a, 28a of the corresponding electrical circuit 21, 22, 23 is switched on. But if the associated PWM signal PMW1, PMW2 or PMW3 assumes the value "0", and a negative voltage is accordingly created, the corresponding lower IGBT 26b, 27b, 28b of the corresponding pair 26a, 27a, 28a, or 26b, 27b, 28b is switched on.

Therefore the fact, that in accordance with FIGS. 8a to 8c at an angle of current flow of 120°, as well as 240°, the first phase current I1 is always zero when the associated voltage U1 assumes a positive value, indicates that the corresponding IGBT 26a is not correctly switched on. Otherwise, at a positive value of the said voltage U1, a corresponding value of the first phase current I1 greater than zero would have to have been measured, as represented in FIGS. 7a to 7c for an error-free system.

Figure 9C:
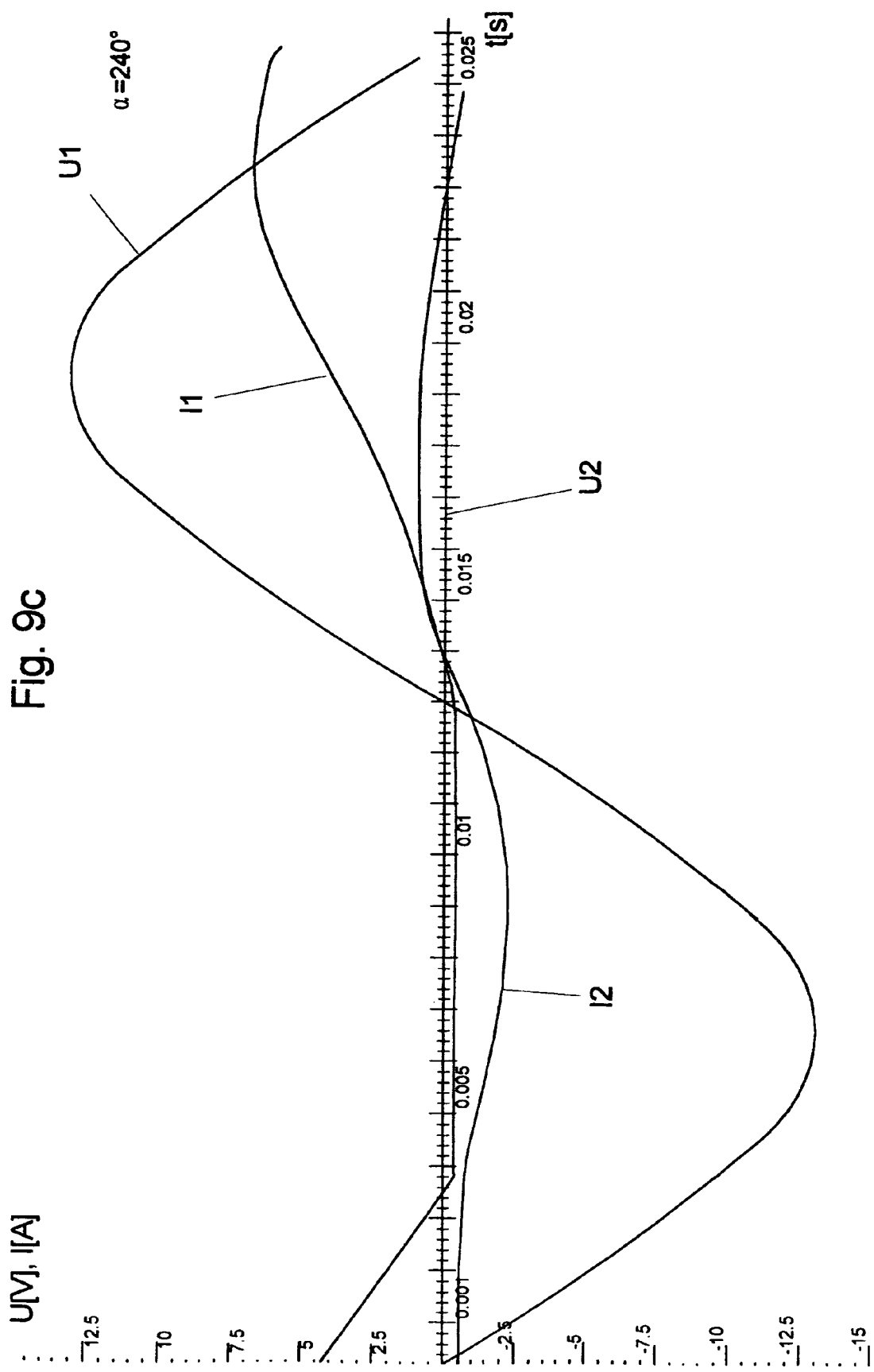
Figure 10B:
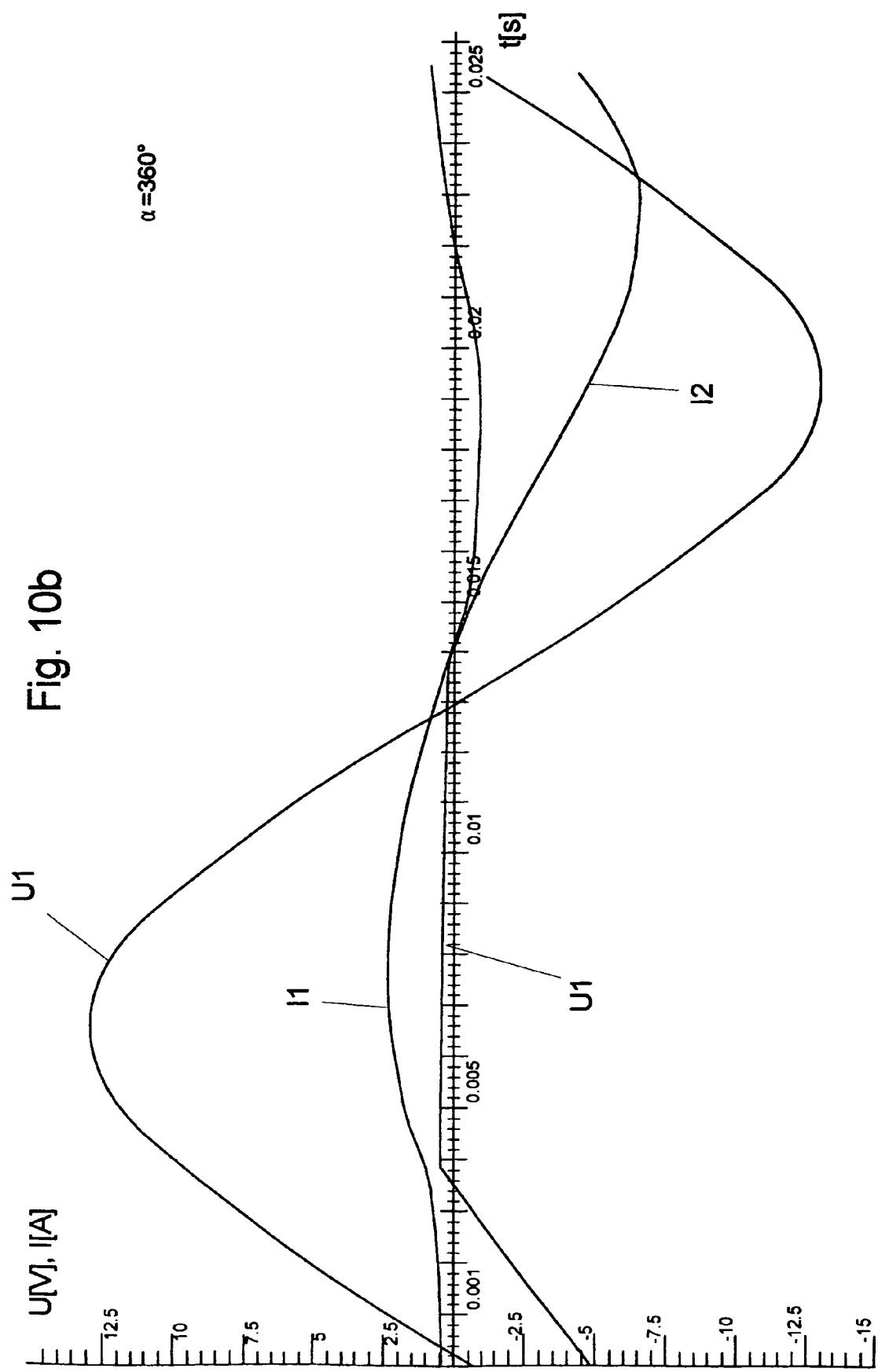
Figure 10C:
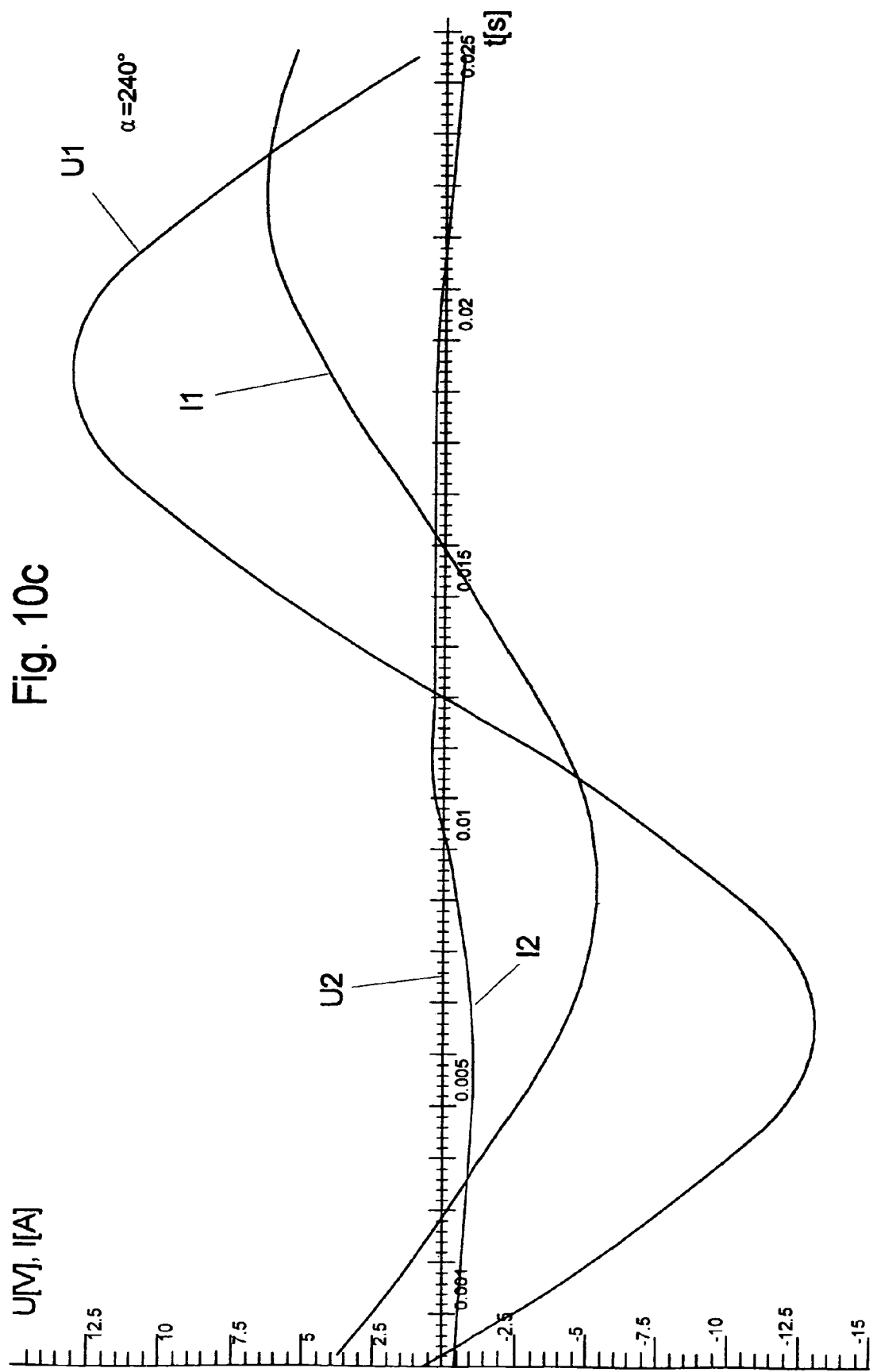
Figure 11A:
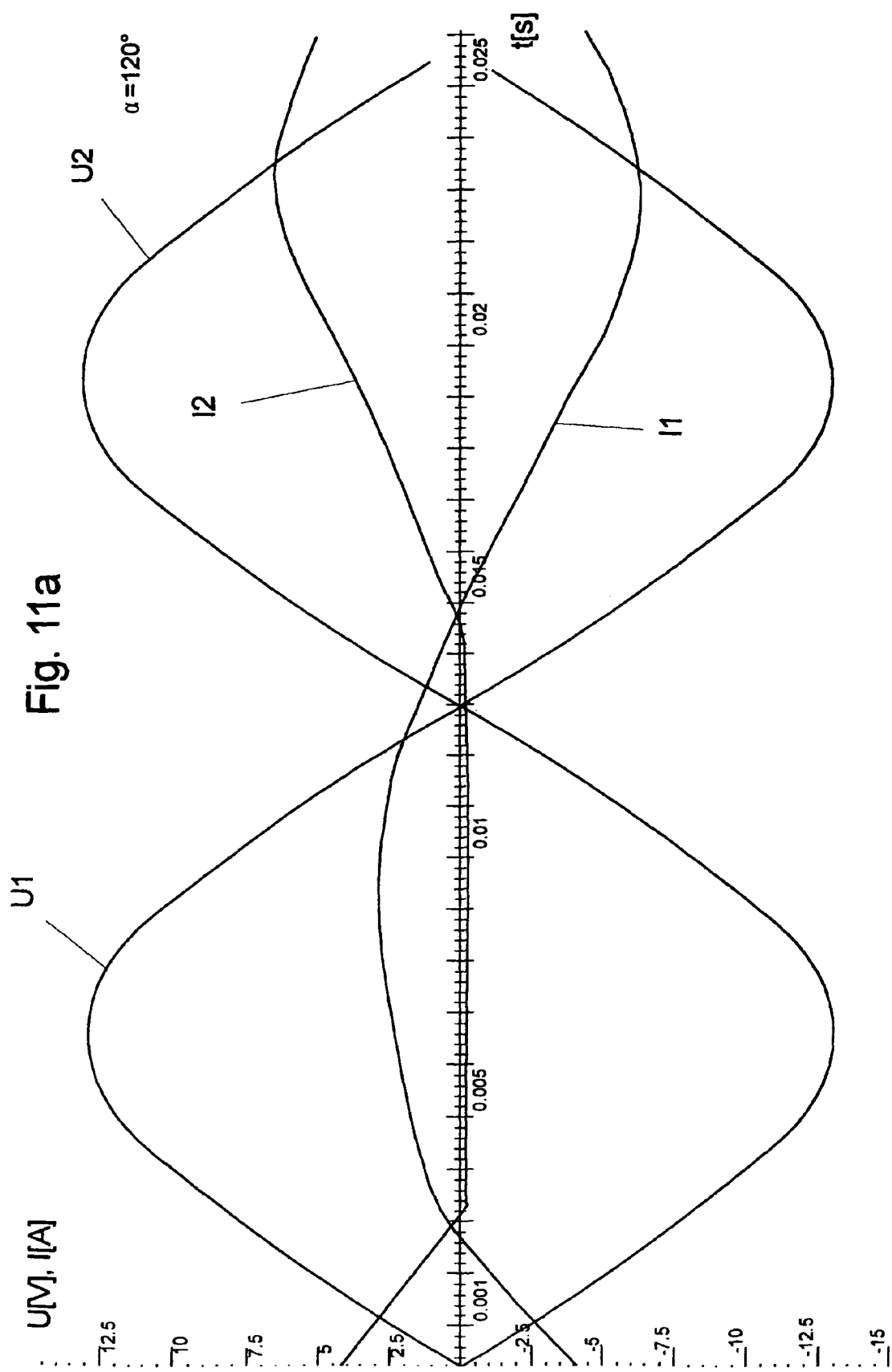
Figure 11B:
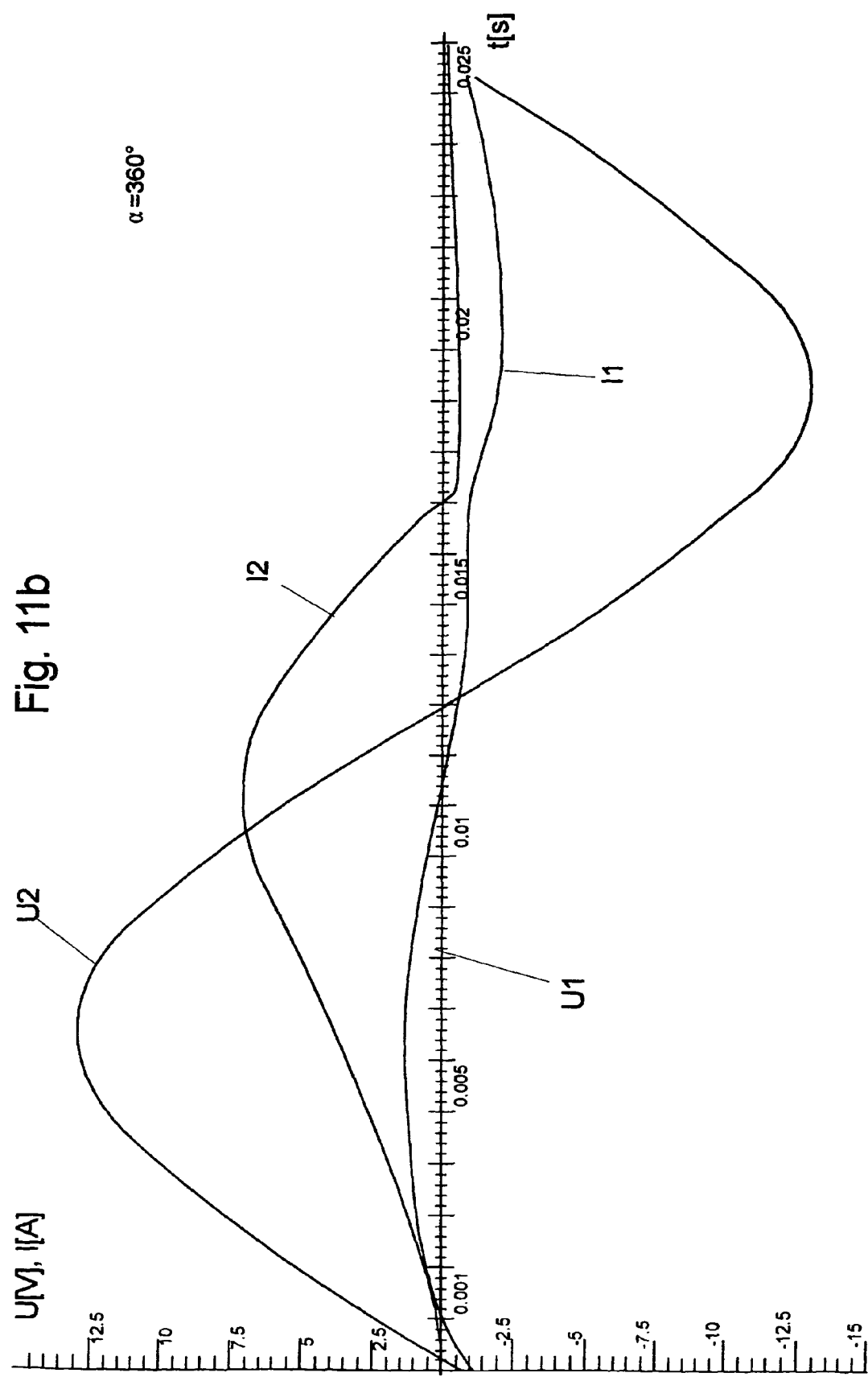
Figure 11C:
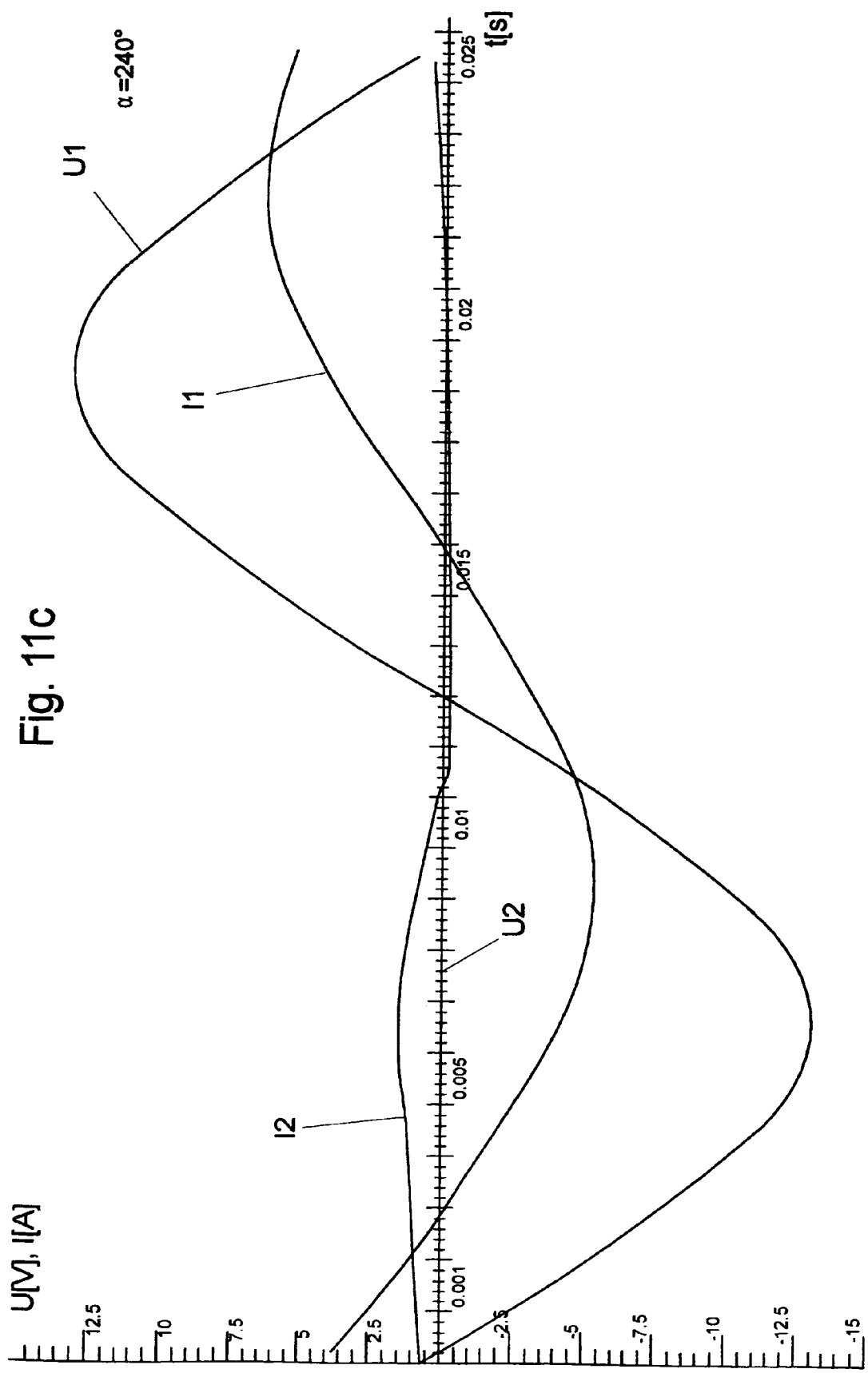
Figure 12A:
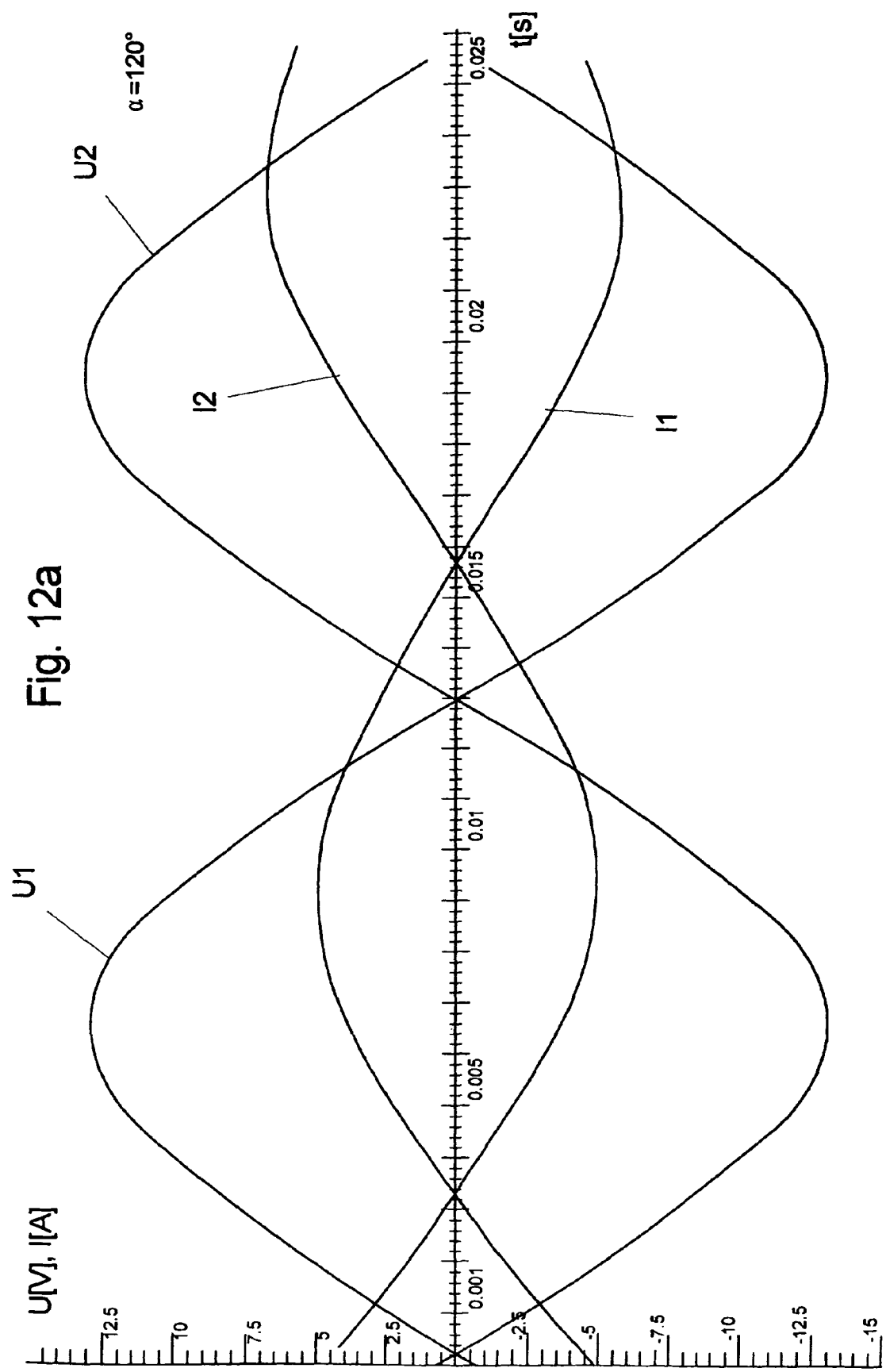
Figure 12B:
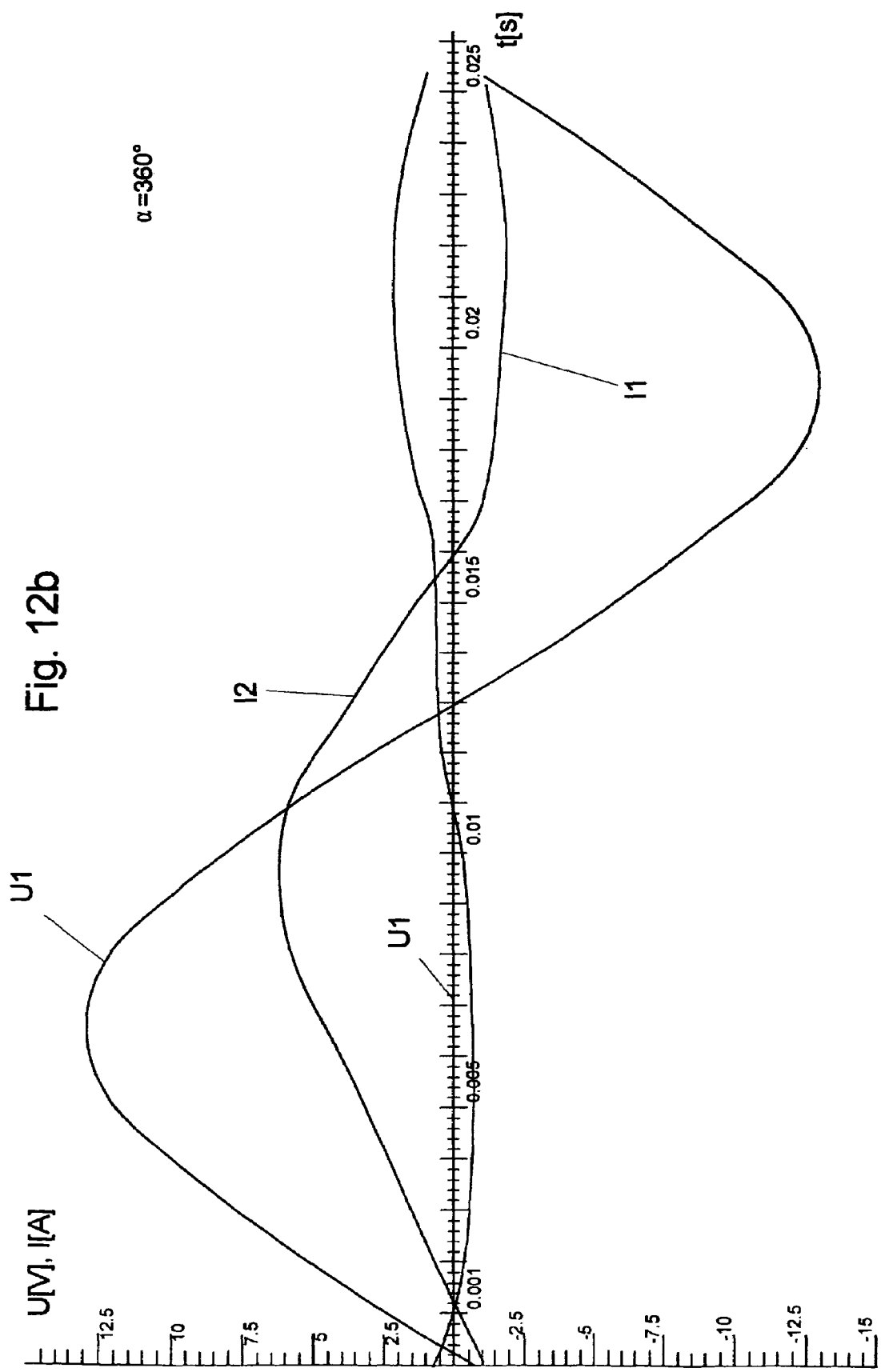
Figure 12C:
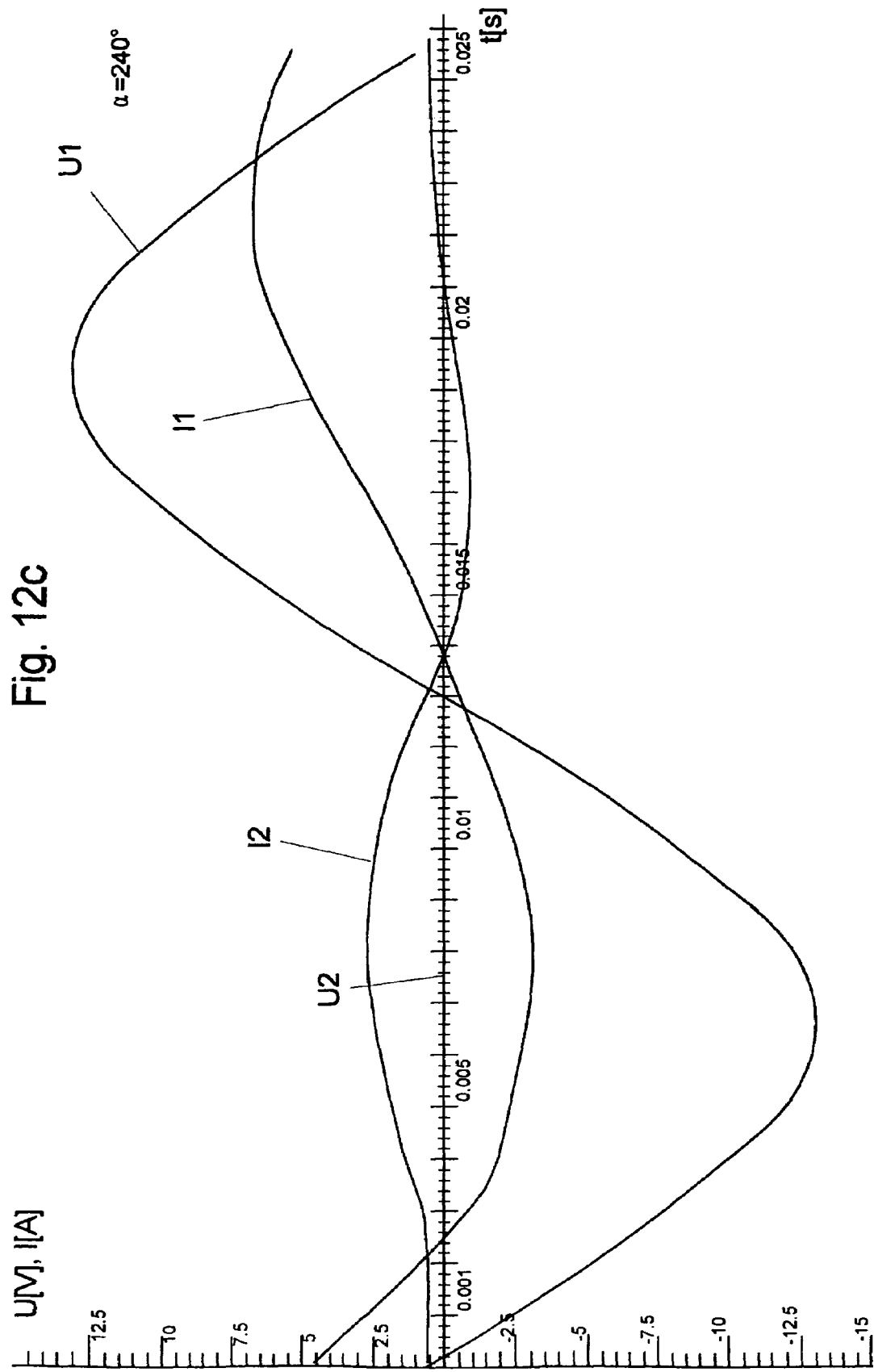
Figure 13A:
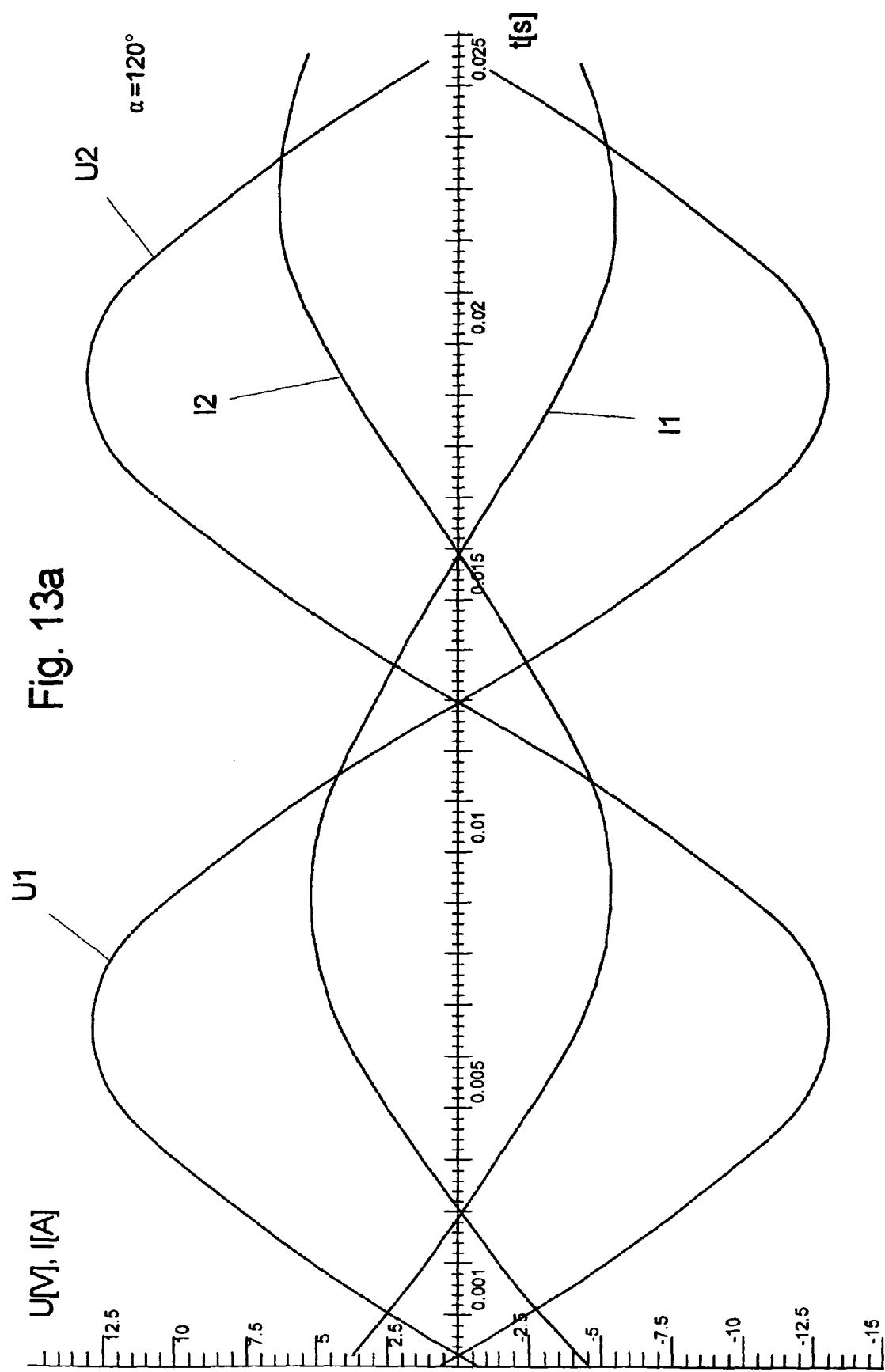
Figure 13B:
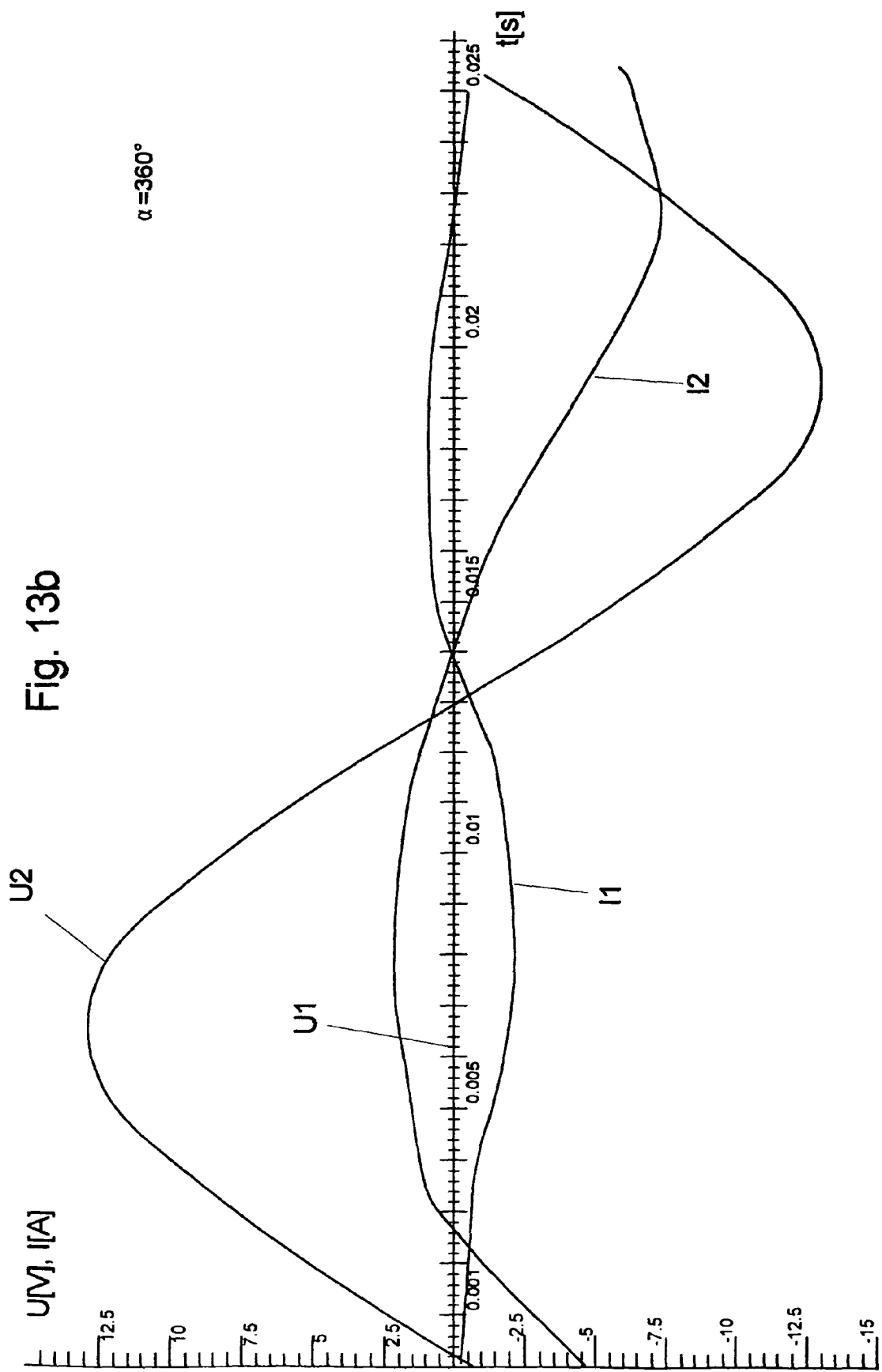
Figure 13C:
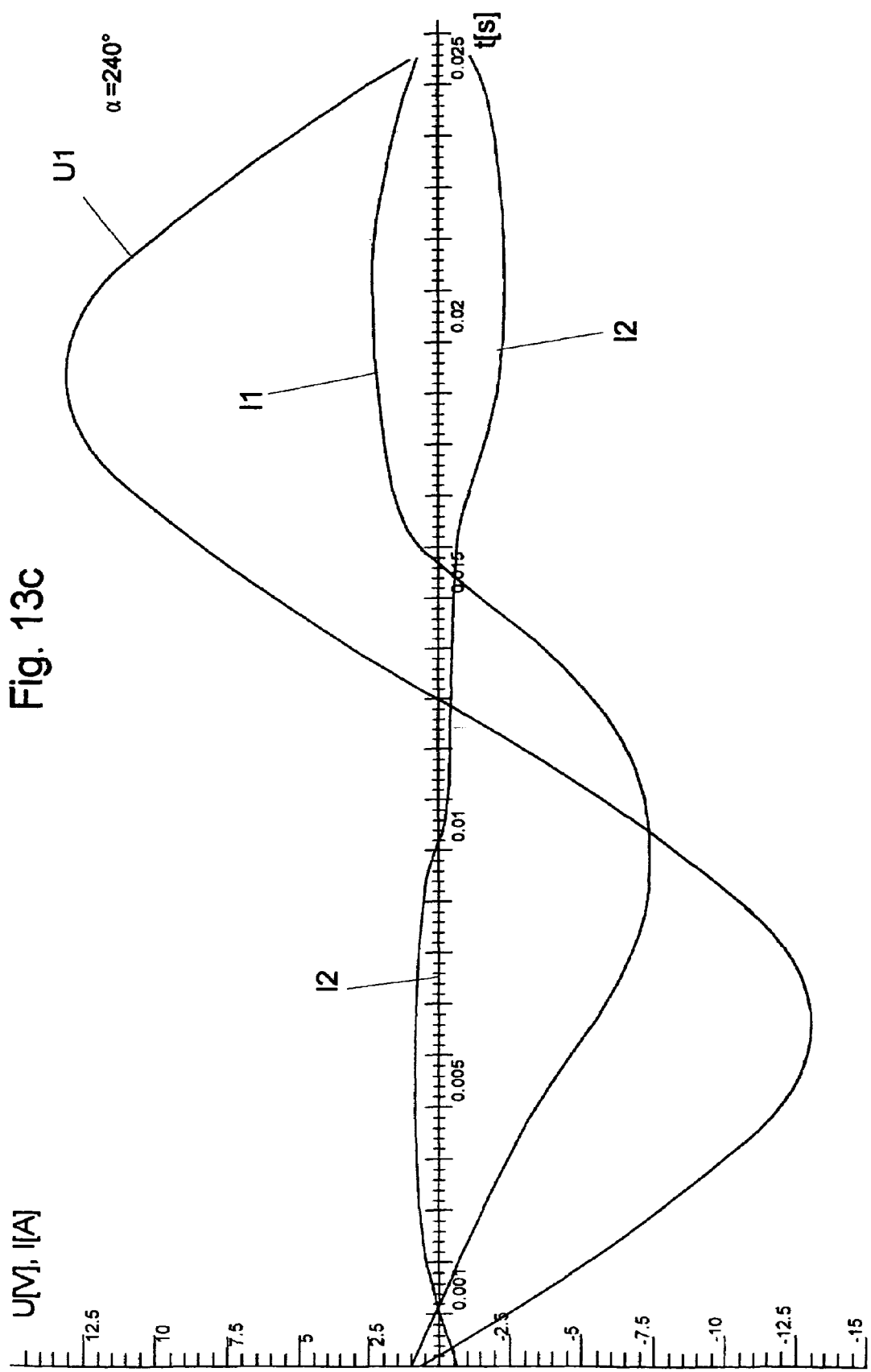

In a corresponding way it can be seen by FIGS. 9a to 9c, that the lower IGBT 26b of the first pair 26a, 26b (of the first electrical circuit 21 of the frequency converter 2) is defective, i.e. does not switch on. Because here the first phase current I1 assumes the value zero in case the associate voltage U1 or U2 is negative, i.e. the lower IGBT 26b should have switched on.

In a corresponding way it is possible to conclude in connection with the current and voltage paths in FIGS. 10a to 10c, 11a to 11c, 12a to 12c and 13a to 13c that the upper IGBT 27a of the second pair 27a, 27b (FIGS. 10a to 10c) is faulty, that the lower IGBT 27b of the second pair 27a, 27b (FIGS. 11a to 11c) is faulty, that the upper IGBT 28a of the third pair 28a, 28b (FIGS. 12a to 12c) is faulty, or that the lower IGBT 28b of the third pair 28a, 28b (FIGS. 13a to 13c) is faulty.

Figure 14A:
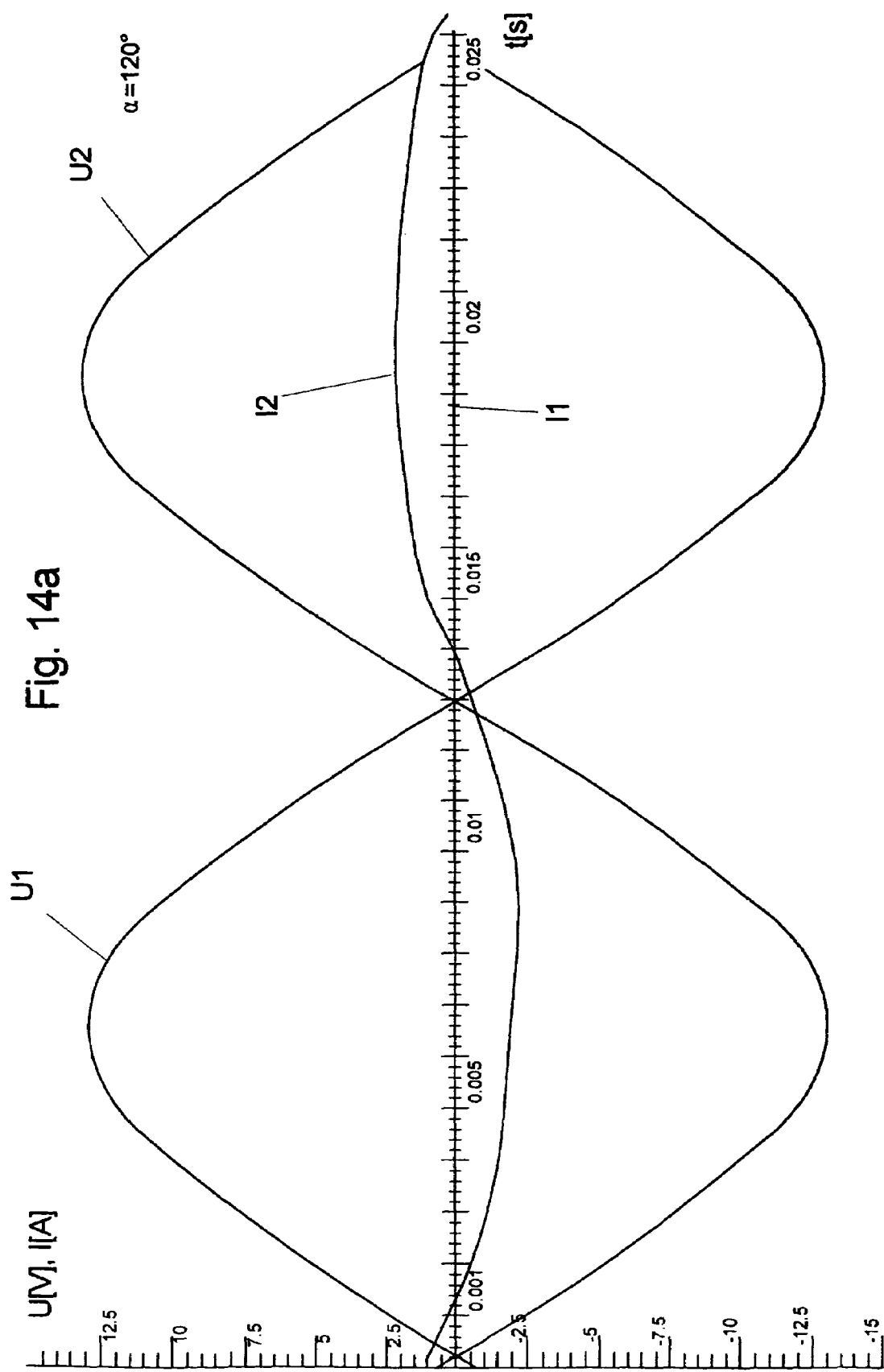
Figure 14B:
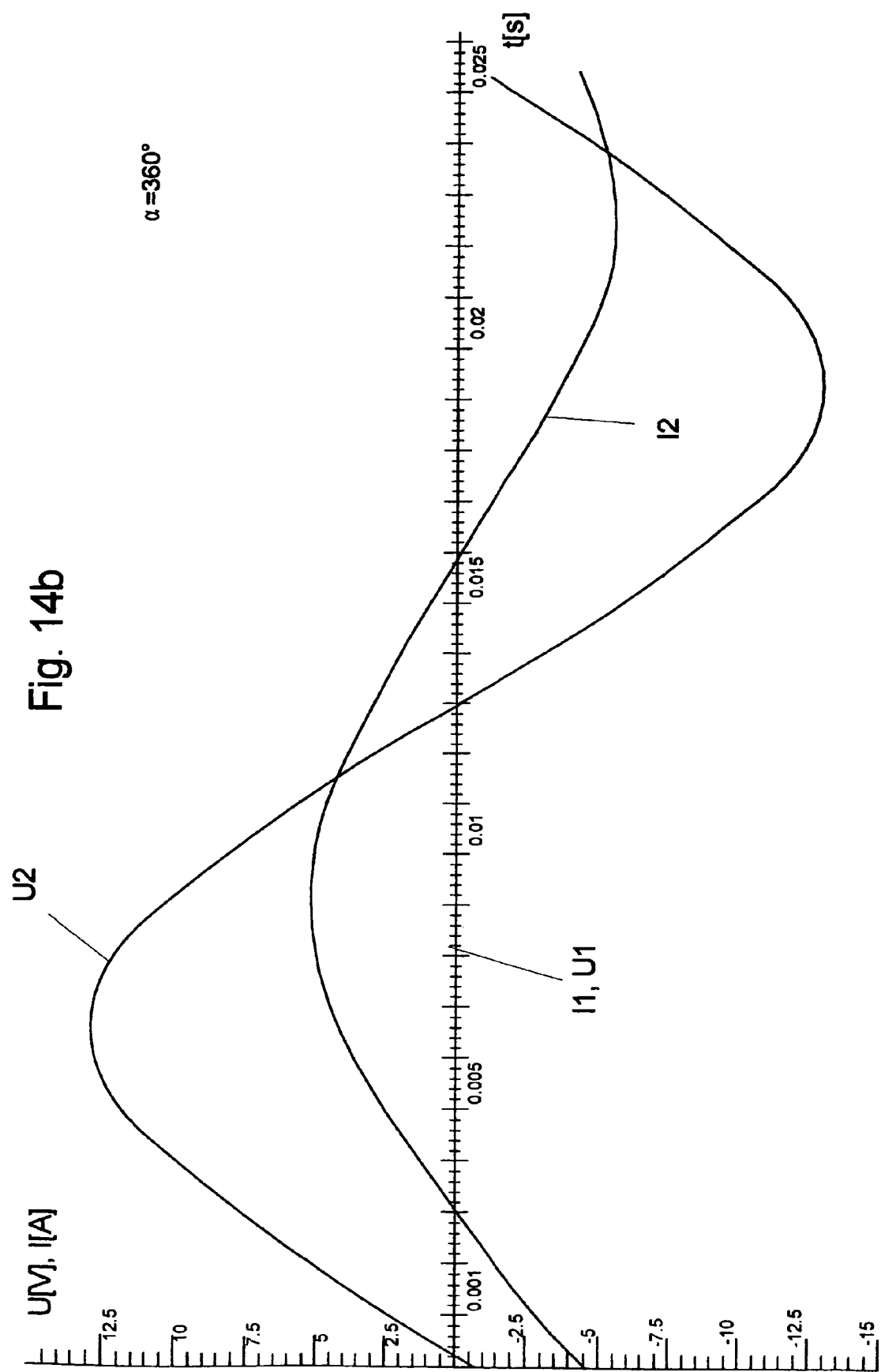
Figure 14C:
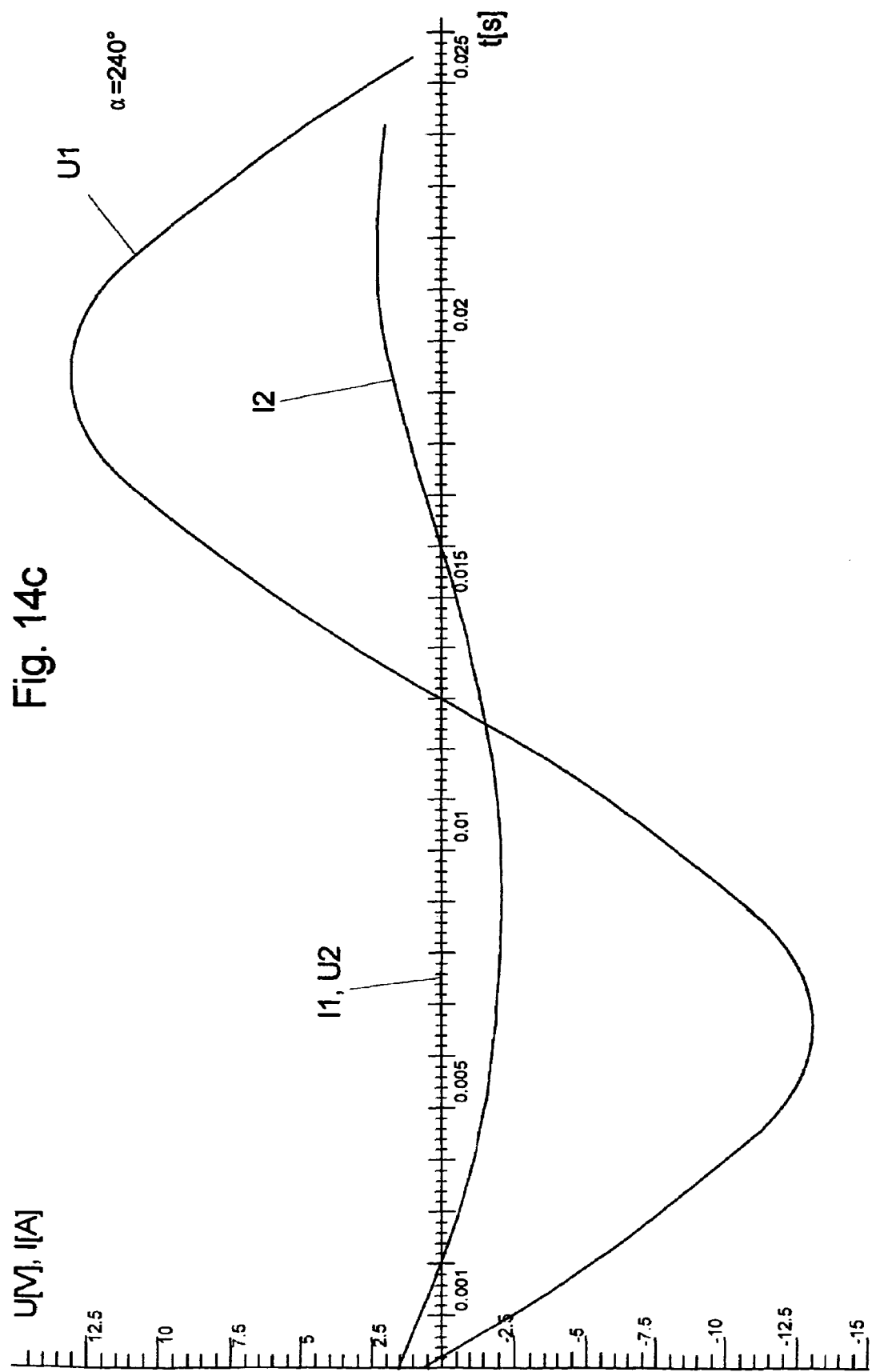
Figure 15A:
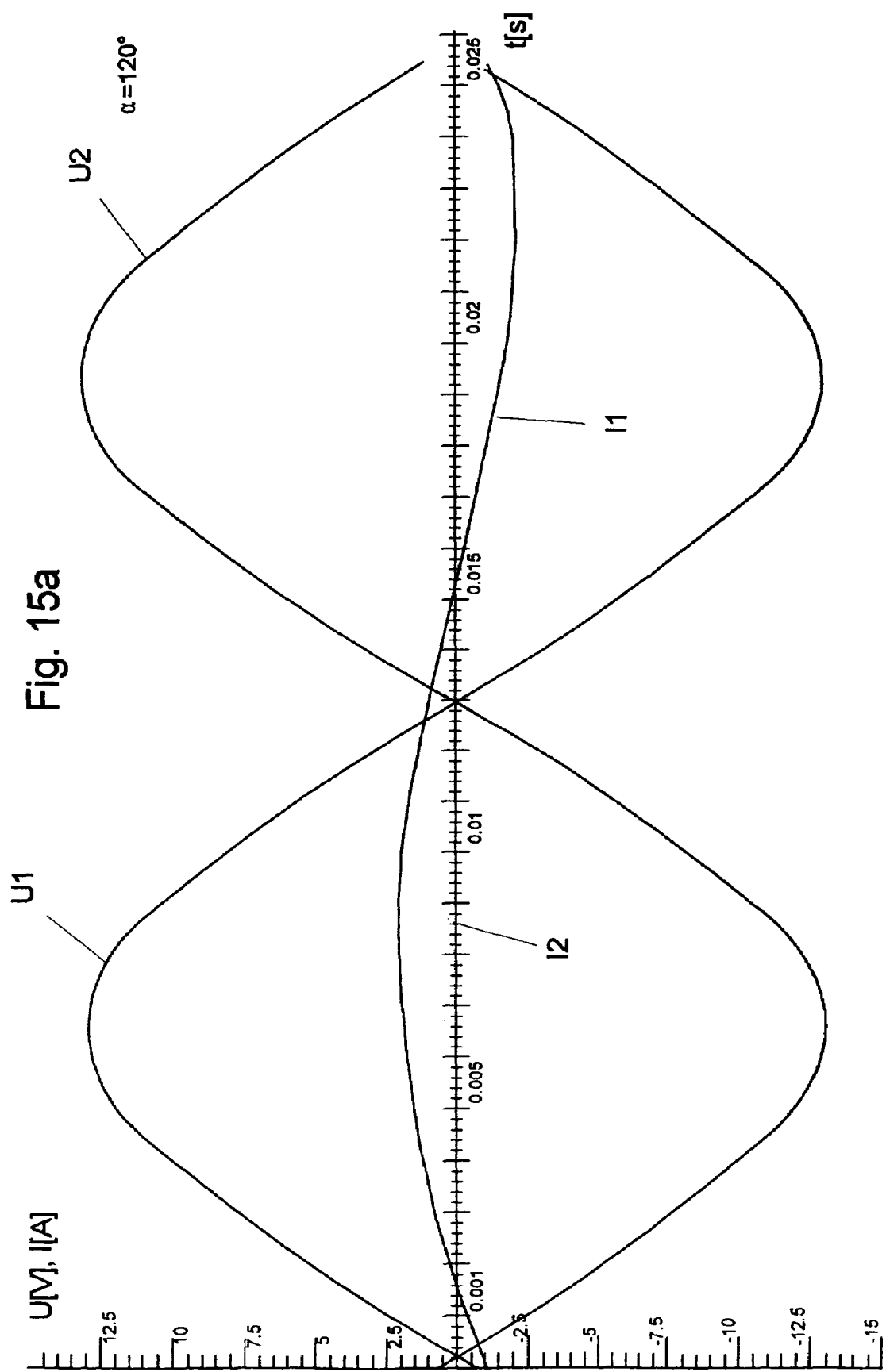
Figure 15B:
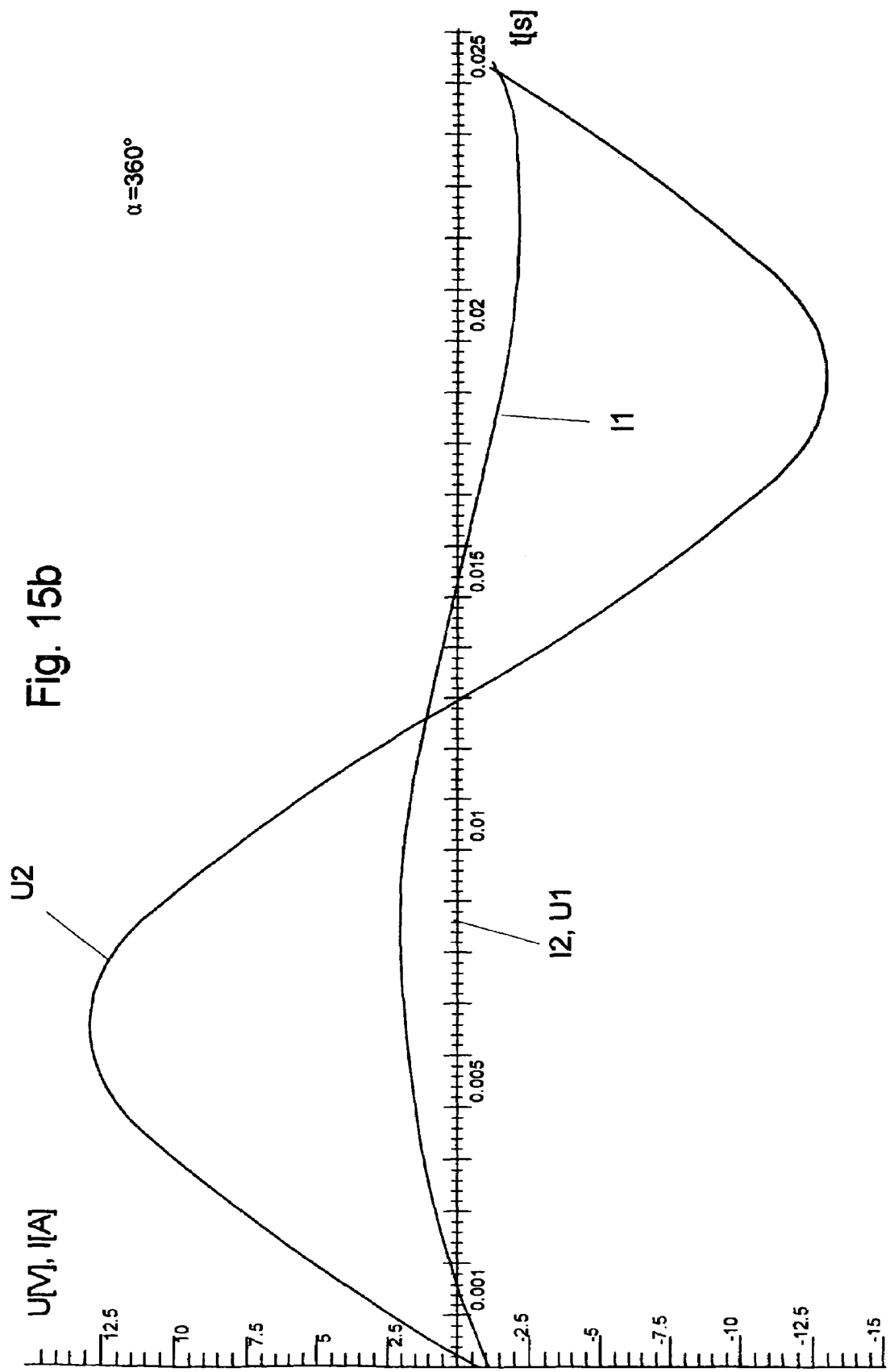
Figure 15C:
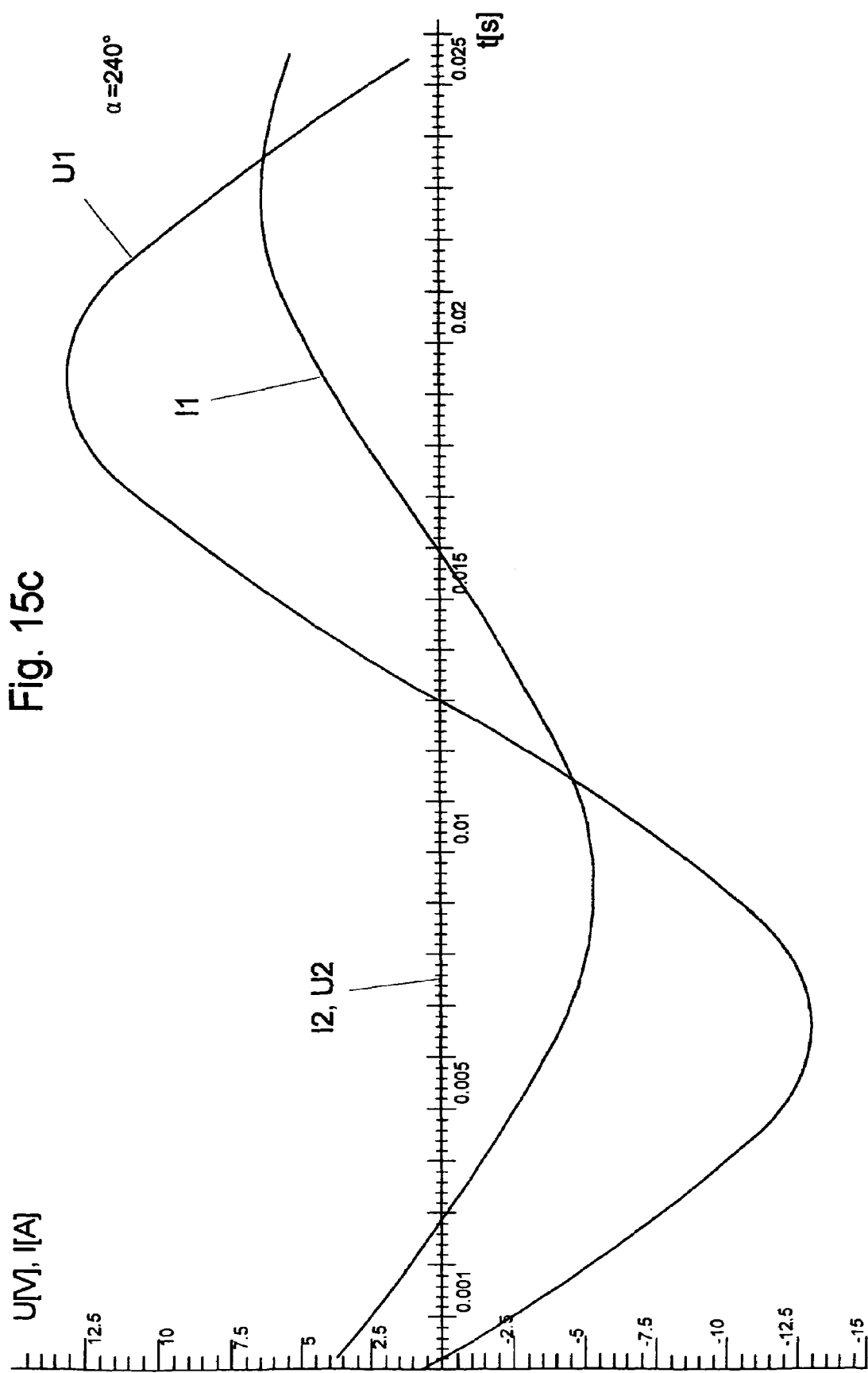

In contrast to this, FIGS. 14a to 14c each show a current measurement at the three angles of current flow of 120°, 240°, as well as 360°, corresponding to the explanations in FIGS. 7a to 7c, in connection with a drive mechanism in accordance with FIG. 1, wherein a disruption ("phase open") exists in the first phase 11 of the drive motor 1. This can be the result of a line break, or of an incorrectly closed contact. As a result thereof the phase current I1 in the first phase 11 of the drive motor 1 is always equal to zero, regardless of the value of the sinusoidally varying voltage U1.

Figure 16A:
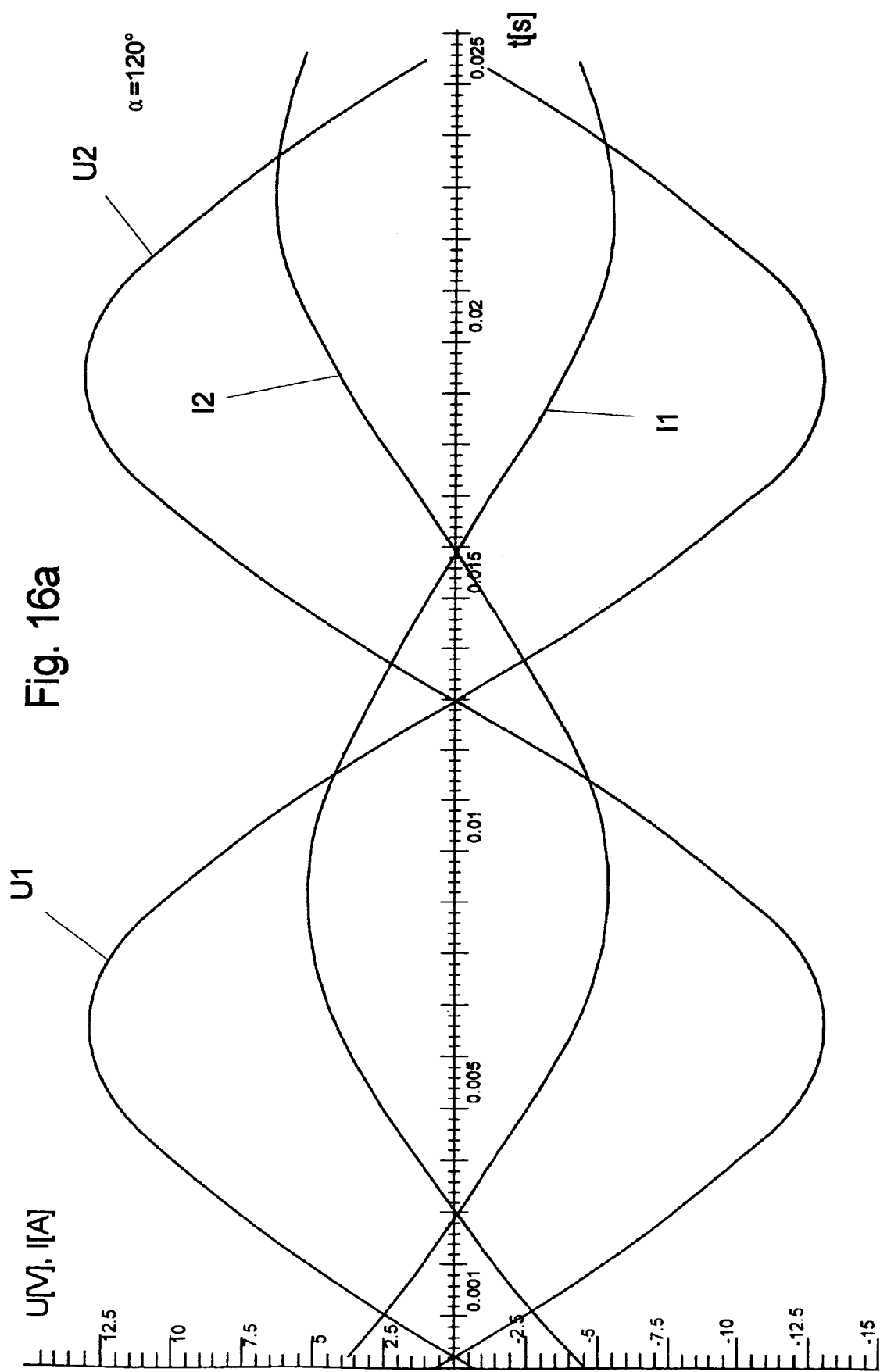
Figure 16B:
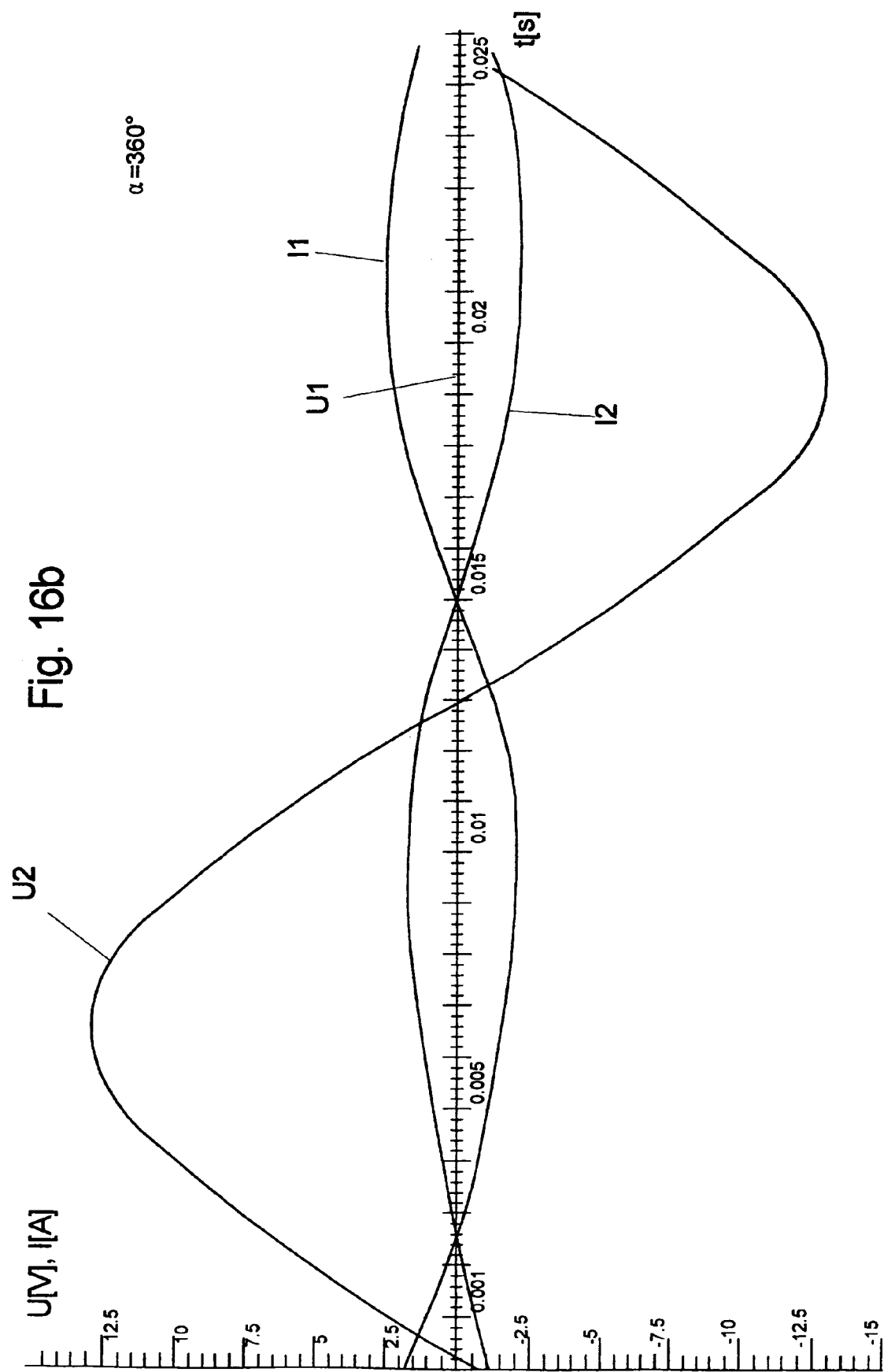
Figure 16C:
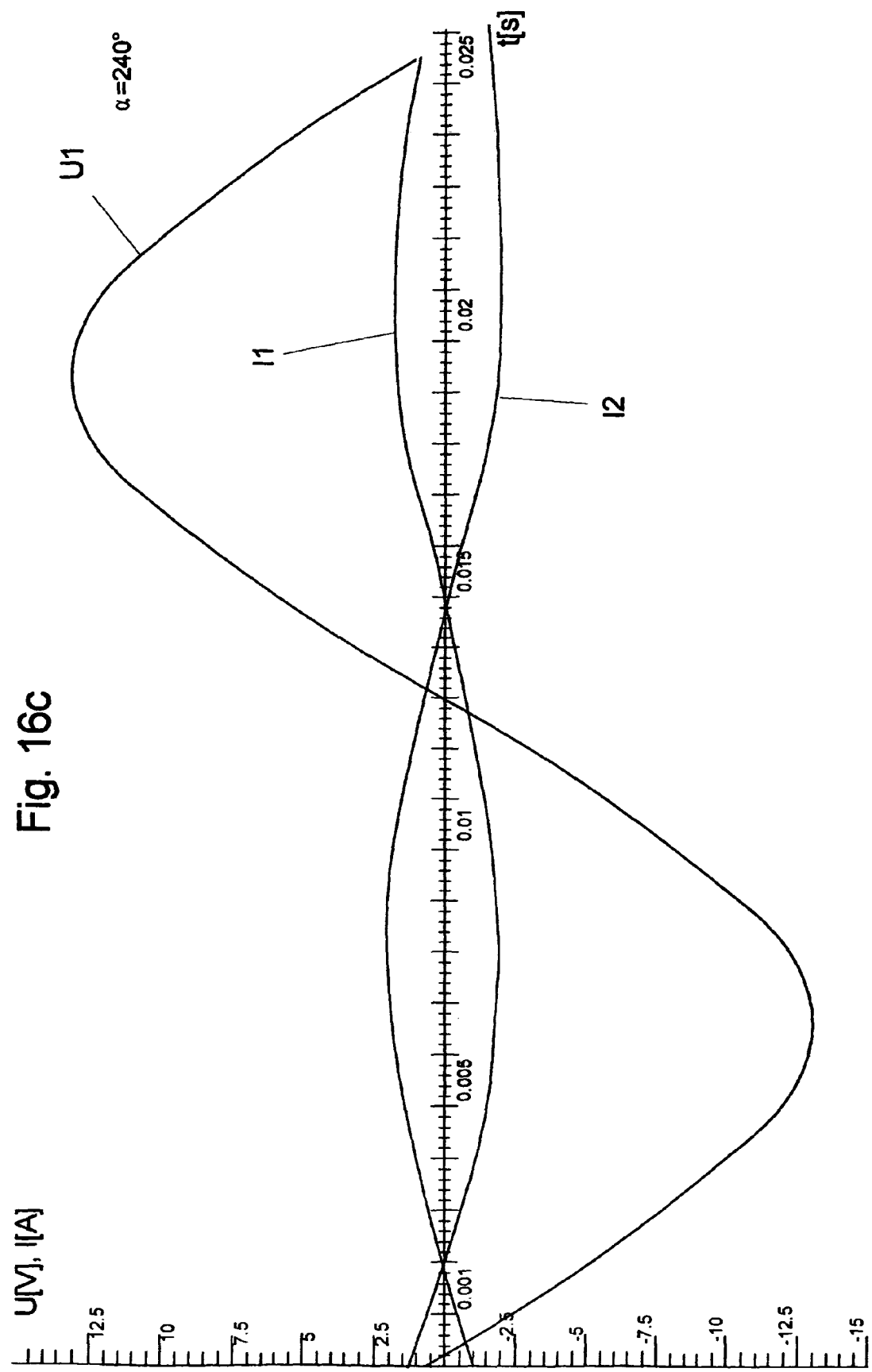

In a corresponding way, in accordance with FIGS. 15a to 15c, or FIGS. 16a to 16c, an evaluation of the measurement shows that a disruption exists in the second phase 12, or the third phase 13 of the drive motor 1, so that the corresponding phase current I2 is always equal to zero (FIGS. 15a to 15c), or the first and second phase currents I1 and I2 add up to a value of zero, even if only one of the two associated voltages U1 or U2 is not equal to zero, see FIGS. 16b and 16c.

For the concrete, automated (computer-controlled) evaluation of the measurement results, such as has been represented by way of example for defined error occurrences by means of FIGS. 7a to 16c, use is made of the fact that the phase currents I1, I2 trail the assigned voltages U1 or U2. Thus, the minima, maxima and zero-crossings of the voltages U1 and U2 underlying the measured phase currents I1, I2 are first determined for the evaluation. Thereafter, the maximum or the minimum of the associated phase current I1 or I2 is determined for each voltage maximum and the subsequent zero-crossing, as well as for each voltage minimum and the subsequent zero-crossing. Thus, the respective maximum of the phase current I1 or I2, which lies between a maximum of the associated voltage U1 or U2 and the subsequent zero-crossing, is determined, as well as the minimum of the respective phase current I1 or I2, which lies between a minimum and a subsequent zero-crossing of the associated voltage U1 or U2.

This will be explained by way of example by FIG. 7a, which shows the two phase currents I1 and I2, as well as the associated voltages U1, U2 for an angle of current flow of 120° in a drive mechanism which does not show any errors to be detected. It can be seen that a maximum of the associated phase current I1 is located between the maximum and the subsequent zero-crossing of the one voltage U1. Correspondingly, a minimum of the associated phase current I1 is located between the minimum of the one voltage U1 and its subsequent zero-crossing. This applies correspondingly to the other voltage U2 and the associated phase current I2.

Therefore respectively two pairs of current values of the phase current I1 and I2 result from each of the three series of measurements which had been recorded at the angles of current flow of 120°, 240° as well as 360°, namely two current values for the first phase current I1 and two current values for the second phase current I2, since an associated current value of each of the corresponding phase currents I1 or I2 is determined from each half period of the associated voltage U1 or U2.

If now the representation in accordance with FIG. 8a is compared with the representation in accordance with FIG. 7a, it can be seen that, because of the faulty upper IGBT 26a of the first pair 26a, 26b, the first phase current I1 does not assume its own maximum between the maximum and the subsequent zero-crossing of the associated voltage U1. The phase current I1 is substantially equal to zero over the entire range (except for noise). Therefore the absence of the current maximum indicates that here the phase current I1 does not act corresponding to the underlying voltage U1 which, in turn, is an indication of a disconnected IGBT 26a.

For the systematic evaluation of the series of measurements of the phase currents I1, I2 on the basis of the above explained principle, the following actions are performed:

The detected current maxima and current minima (each occurring between a maximum and a zero-crossing, or a minimum and a zero-crossing, of the underlying electrical voltage) are evaluated to determine whether they represent an actual current maximum or current minimum, or whether merely the maximum or minimum of the noise had been measured, while the current is actually substantially equal to zero. For this purpose the values of the measured current maxima or current minima are compared with the maximally measured current value Imess, using an evaluating factor k. The latter can have the value k=0.2, for example. The maxima and minima of the phase currents I1, I2 determined in the manner explained above are then each evaluated as to whether their value is greater or less than k-times the greatest measured current Imess. The presence of a real current maximum or minimum is assumed only if the former is the case. Otherwise it is assumed that the respective current is substantially equal to zero and that only the noise was measured.

In this case the following equations apply for forming a table which can be systematically evaluated:

If $|I|>k*|Imess|$ & $I>0$, the value "1" is assigned to the corresponding current I (in this case the current I selectively represents the measured values of the phase current I1 or I2).

If $|I|\leq k*|Imess|$, the corresponding current is assigned the value "0".

If $|I|>k*|Imess|$ & $I<0$, the corresponding current is assigned the value "−1".

Thus, for detecting an error, the actually measured current values are not directly evaluated, instead the current path between a maximum of the underlying voltage and a zero-crossing of the underlying voltage is assigned the value "1" or "0", wherein the value "1" means that in the said range a current maximum has occurred, and the value "0" means that the current in the respective range is substantially equal to zero. In a corresponding manner the respectively measured current is assigned the value "−1" between a voltage minimum and the subsequent zero-crossing, if an actual minimum of the respective current has occurred here, otherwise the value "0". Thus, the results of the current measurements can be represented in a table, wherein each one of the observed angles of current flow of 120°, 240°, as well as 360°, is assigned four current values, namely two values of the first phase current I1 and two values of the second phase current I2. In turn, these values are sorted to determine whether they represent a range between a maximum and a subsequent zero-crossing, or between a minimum and a subsequent zero-crossing of the associated voltage.

This table can then be evaluated in the same way as the actual current values were evaluated above by FIGS. 7a to 15c. This has already been explained by FIGS. 7a and 8a and also applies to the further drawing figures. The above evaluation has shown that the entire measured current path is not necessary for detecting an error, it is merely important that the respectively measured phase current in a defined range of the associated electrical voltage is greater than zero, equal to zero or less than zero. This can be determined by the criteria applied for forming the table while detecting the current maxima or minima.

As demonstrated by FIGS. 7a to 15c, it is possible in particular to distinguish whether there is an error in an IGBT, or one of the phases I1, I2, I3 of the drive motor 1 is open. In the latter case the associated phase current is always equal to zero, regardless of the chronologically varied voltage, while in the first mentioned case the corresponding phase current is equal to zero only if it depends from a faulty IGBT. In this case the faulty behavior of the IGBT can also have its source in the associated logical control device.

The said errors in the frequency converter 2 on the one hand, and the drive motor 1 on the other, can also be distinguished from a defect of one of the two current sensors 41, 42 ("current sensor stuck at full deflection"), since in case of a defect in one of the current sensors 41, 42 it can be expected that the current sensor always supplies the same current value, regardless of any of the voltages.

An explanation will now be given by the representation in the form of a table in FIG. 17 as to how the test for a short circuit between two phases of the drive motor 1 mentioned in the description of the entire method by the flow chart in FIG. 2 is performed. This test is always performed when in the course of the measurements of the phase current 11, 12 an overcurrent has occurred, see FIG. 2.

A total of three measurements is performed for the test for a phase short circuit, namely at angles of current flow of 90°, 210° and 330°. At these angles of current flow, respectively two of the phases 11, 12, 13 are connected to an identical potential, while the third phase is connected to another, different potential. Thus, a corresponding first voltage value, for example −U/2, is present at the two first phases, and a another voltage value differing therefrom, for example U, is present at the third phase.

If a short circuit, corresponding to an overcurrent in at least one of the IGBTs, is observed in the course of one of the three measurement steps, it cannot have occurred between the two phases connected to an identical electric potential, since with an identical electrical potential even short-circuited lines do not generate a current flow. An appropriate decision matrix is represented in FIG. 17.

Accordingly, in the three measurement steps the three voltages U1, U2, U3 of the phases 11, 12, 13 of the drive motor 1 are varied, as explained above, wherewith respectively one of the phases is connected with the potential "U", and the two other phases with the potential "−U/2". Depending on the distribution of the values "0" and "1" in the error output "ERR" it can then be determined whether there is no short circuit, or possibly which one of the three phases 11, 12, 13 is short-circuited.

If the test for a short circuit between the phases 11, 12, 13 of the drive motor 1 terminates with the result that in all three measurement steps the value "0" appears at the error output "ERR", a check is made in accordance with FIG. 2 whether the cause of a previously detected overcurrent in an IGBT is a result of a line-to-ground fault in one of the phases 11, 12, 13 of the drive motor 1. Alternatively, there can be a short circuit in one of the IGBTs themselves.

Figure 18:
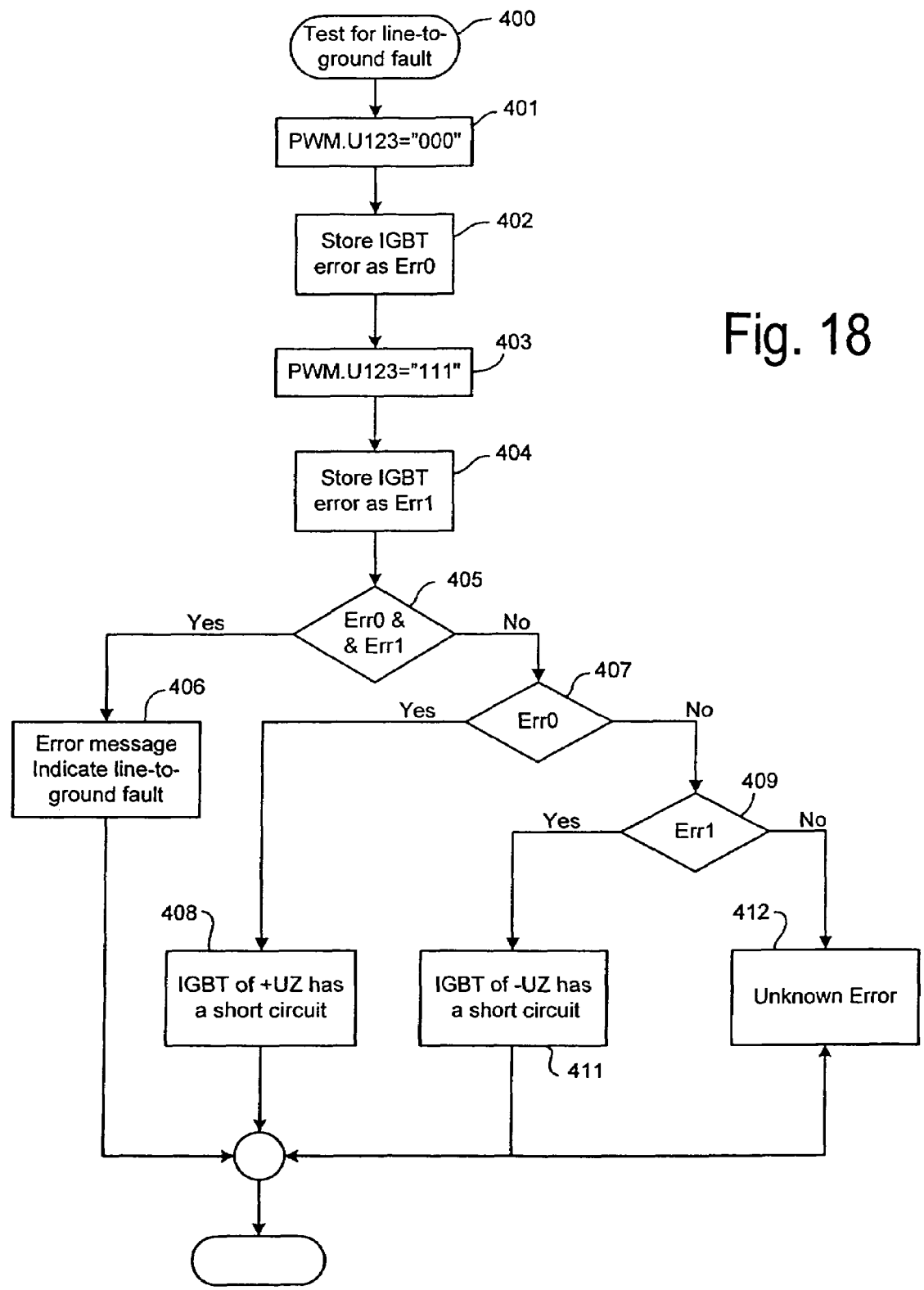
FIG. 18 is a flow chart for an embodiment of a method of detecting a line-to-ground fault in one of the phases of the electric motor in FIG. 1.

In accordance with FIG. 18, for performing the test 400 for a line-to-ground fault, first all PWM signals PWM1, PWM2, PWM3 are fixed at the value "0" (401). This means that respectively the lower IGBT 26b, 27b and 28b of the three IGBT pairs of the frequency converter is switched on. A switch-off 402 because of an overcurrent occurring in the course of this is stored as "Err0". Subsequently, the three PWM signals PWM1, PWM2, PWM3 are set to the value "1", so that the upper IGBTs 26a, 27a and 28a are switched on (403). An overcurrent measured in the course of this will be stored as "Err1" in the next step 404.

Subsequently a check is made in a further step 405 whether both the error "Err0" and "Err1" are present. An error message 406 will be output in this case, so that a line-to-ground fault is indicated, since in case of a line-to-ground fault an overcurrent occurs in the respective phase 11, 12 or 13 of the drive motor 1 regardless of which one of the two respectively associated IGBT's is switched on.

If, however, the inquiry at 405 is negative, a check is made in two further steps 407 and 409 whether one of the two errors "Err0" or "Err1" is present. In the first case there is a short circuit in one of the upper IGBTs 26a, 27a, 28a, by which the motor phases U1, U2 and U3 can be switched to the upper intermediate circuit voltage Uz/2. In the other case there is a short circuit in one of the lower IGBTs 26b, 27b, 28b, by which the lower intermediate circuit voltage −Uz/2 can be applied to the respective motor phases U1, U2 or U3. The reason for this lies in that with a short circuit in one IGBT a switch-off because of an overcurrent takes place exactly at the time at which the respectively other IGBT of the same IGBT pairs is switched on.

The detection of a short circuit in one of the upper or lower IGBTs leads to an appropriate error message 408 or 411. A separate error message 412 is issued if neither a line-to-ground fault nor a short circuit in one of the IGBTs was detected during the performance of the test. This can also indicate an error in the performance of the test itself.

Further exemplary embodiments exist within the scope of the present invention besides the described examples.

We claim:

1. A method for error detection in a drive mechanism, having a multiphase electric motor and a converter connected upstream thereof, wherein said converter controls voltages of individual phases of said electric motor, and individual phase currents in said individual phases of said electric motor each extend periodically, the method comprising:
   measuring a phase current of said electric motor at a predetermined point of a respective period;
   simultaneously varying a voltage that is associated with said measured phase current;
   evaluating a measured value of said measured phase current as a function of said voltage that is associated with said measured phase current, wherein said evaluating allows distinguishing between an error in said converter and a disruption of current flow in a phase of said electric motor that corresponds to said measured phase current; and
   wherein in case of a disruption in a phase of said electric motor, said measured phase current is equal to zero, regardless of a value of said associated voltage, and in case of an error in a converter valve of said converter, said measured phase current is equal to zero only for a portion of said value of said associated voltage.

2. The method in accordance with claim 1, wherein said disruption of current flow is caused by a line break or an open electrical contact.

3. The method in accordance with claim 1, wherein said error in said converter is caused by a faulty converter valve.

4. The method in accordance with claim 3, wherein said converter valve is in the form of a transistor or a thyristor.

5. The method in accordance with claim 1, wherein said measured phase current is equal to zero at the point of said period at which said measuring is performed.

6. The method in accordance with claim 1, wherein said individual phase currents are phase-shifted with respect to each other by a defined amount, and said measuring takes place at a defined point of one of the periods of said individual phase currents.

7. The method in accordance with preceding claim 1, wherein a ratio of said converter control voltages which are not equal to zero during the respective current measurement remains constant during the measurement, and the sum of said converter control voltages is equal to zero during the measurement.

8. The method in accordance with claim 1, wherein said voltage during said measuring said phase current is periodically varied during said measuring.

9. The method in accordance with claim 8, wherein said voltage passes through exactly one period during said measuring.

10. The method in accordance with claim 9, wherein said voltage has a zero-crossing that extends sinusoidally.

11. The method in accordance with claim 8, wherein said evaluating is performed at a maximum or a minimum of said measured current located between a maximum or minimum and a zero-crossing of said voltage associated with said measured phase current.

12. The method in accordance with claim 1, wherein a value of said measured phase current is stored in the form of a table for evaluating said measured phase current.

13. The method in accordance with claim 1, wherein said multiphase electric motor is embodied as a three-phase motor.

14. The method in accordance with claim 1, characterized in that several measurements of said measured phase current are performed for error detection at a respectively predefined point of the period.

15. The method in accordance with claim 14, further comprising measuring other phase currents associated with the remaining phases of said electric motor other than said phase associated with said, said measuring other phase is performed simultaneously with said measuring a phase current and said measured phase current and said other phase currents are each measured a number of times equal to the number of phases of said electric motor.

16. The method in accordance with claim 15, wherein during said measuring of said phase current and said other phase currents, one of said phase currents has a value equal to zero.

17. The method in accordance with claim 1, wherein said evaluating comprises evaluating said measured current at points of a respective current path which is defined by a path of said voltage associated with said measured phase current.

18. The method in accordance with claim 1, further comprising determining behavior of a second phase current based on a value of said measured phase current.

19. The method in accordance with claim 1, further comprising generating an input signal of said converter as a function of an output signal of a controller, wherein said controller generates pulse width modulated signals.

20. The method in accordance with claim 19, further comprising checking said output signal at an interface between said controller and said converter for an error in said output signal by an evaluation circuit.

21. The method in accordance with claim 20, further comprising:
varying said output signal in accordance with a preset pattern; and
measuring and evaluating a voltage signal generated at an input of said converter as a function of said output signal.

22. The method in accordance with claim 21, wherein said error is considered to have been detected if an expected voltage signal based on said output signal does not appear.

23. The method in accordance with claim 21, wherein said evaluating said voltage signal generated at said input of said converter comprises linking different voltage signals generated at said input of said converter with said output signal of said controller to each other.

24. The method in accordance with claim 23, wherein said linking is performed by at least one logical gate.

25. The method in accordance with claim 1, further comprising checking whether a short circuit exists between two phases of said electric motor in case of an appearance of an overcurrent during said measuring.

26. The method in accordance with claim 25, wherein said checking is only performed when an overcurrent has occurred in a converter valve of said converter.

27. The method in accordance with claim 25, wherein said checking comprises connecting two phases of said electric motor to a common electrical potential.

28. The method in accordance with claim 27, wherein said checking comprises connecting said two phases of said electric motor one after the other to said common electrical potential in order to determine between which phases said short circuit has occurred by evaluating phase currents occurring during said connecting.

29. The method in accordance with claim 27, further comprising determining said voltage of said measured phase current by determining an angle of current flow of said measured phase current.

30. The method in accordance with claim 1, further comprising checking whether a line-to-ground fault exists in a phase of said electric motor that corresponds to said measured phase current when an overcurrent in a converter valve of said converter exists.

31. The method in accordance with claim 30, wherein said checking comprises charging individual circuits of said converter connected upstream of said phases of said electric motor with identical input signals.

32. The method in accordance with claim 31, wherein each of said individual circuits is assigned to a corresponding one of said phases of said electric motor.

33. The method in accordance with claim 32, wherein each of said individual circuits have transistors or thyristors arranged in pairs.

34. The method in accordance with claim 33, wherein each of said electrical circuits cause one of two possible voltages to be applied to a respective phase as a function of said input signal of said converter.

35. The method in accordance with claim 31, wherein said checking comprises setting each voltage that is associated with said individual phase of said electric motor to an identical value.

* * * * *

UNITED STATES PATENT AND TRADEMARK OFFICE
CERTIFICATE OF CORRECTION

PATENT NO.         : 7,355,436 B2                                      Page 1 of 1
APPLICATION NO.    : 10/633275
DATED              : April 8, 2008
INVENTOR(S)        : Georg Zehentner et al.

It is certified that error appears in the above-identified patent and that said Letters Patent is hereby corrected as shown below:

In the Claims

In column 15, in claim 15, line 4, after "associated with" delete "said, said" and substitute --said measured phase current, said-- in its place.

Signed and Sealed this

Twentieth Day of January, 2009

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,355,436 B2 | Page 1 of 1 |
| APPLICATION NO. | : 10/633275 | |
| DATED | : April 8, 2008 | |
| INVENTOR(S) | : Georg Zehentner et al. | |

It is certified that error appears in the above-identified patent and that said Letters Patent is hereby corrected as shown below:

<u>In the Claims</u>

In column 15, in claim 15, line 17, after "associated with" delete "said, said" and substitute --said measured phase current, said-- in its place.

This certificate supersedes the Certificate of Correction issued January 20, 2009.

Signed and Sealed this

Seventeenth Day of February, 2009

JOHN DOLL
*Acting Director of the United States Patent and Trademark Office*